US007076753B2

(12) United States Patent
Cerny et al.

(10) Patent No.: US 7,076,753 B2
(45) Date of Patent: Jul. 11, 2006

(54) METHOD AND APPARATUS FOR SOLVING SEQUENTIAL CONSTRAINTS

(75) Inventors: Eduard Cerny, Worcester, MA (US); Ashvin Mark Dsouza, Chelmsford, MA (US); Kevin Michael Harer, Beaverton, OR (US); Pei-Hsin Ho, Portland, OR (US)

(73) Assignee: Synopsys, Inc., Mountain View, CA (US)

( * ) Notice: Subject to any disclaimer, the term of this patent is extended or adjusted under 35 U.S.C. 154(b) by 368 days.

(21) Appl. No.: 10/740,033

(22) Filed: Dec. 18, 2003

(65) Prior Publication Data

US 2005/0138585 A1 Jun. 23, 2005

(51) Int. Cl.
*G06F 17/50* (2006.01)
*G06F 19/00* (2006.01)

(52) U.S. Cl. ............ 716/5; 716/3; 716/18; 703/16
(58) Field of Classification Search ............ 716/5, 716/3, 18; 703/16, 17; 714/741, 33; 324/750
See application file for complete search history.

(56) References Cited

U.S. PATENT DOCUMENTS

| 5,633,803 | A | * | 5/1997 | Silve et al. ............ 716/1 |
| 5,875,196 | A | * | 2/1999 | Chakradhar et al. .... 714/724 |
| 5,956,497 | A | * | 9/1999 | Ratzel et al. ............ 716/1 |
| 6,163,876 | A | * | 12/2000 | Ashar et al. ............ 716/5 |
| 6,247,163 | B1 | * | 6/2001 | Burch et al. ............ 716/3 |
| 6,324,671 | B1 | * | 11/2001 | Ratzel et al. ............ 716/1 |
| 6,341,361 | B1 | * | 1/2002 | Basto et al. ............ 714/726 |
| 6,389,580 | B1 | * | 5/2002 | Ozaki ............ 716/6 |
| 6,470,486 | B1 | * | 10/2002 | Knapp ............ 716/18 |
| 6,697,880 | B1 | * | 2/2004 | Dougherty ............ 719/320 |

(Continued)

OTHER PUBLICATIONS

Hsieh et al., "Synchronous Approach to the Functional Equivalence of Embedded System Implementations", IEEE Transactions on Computer-Aided Design of Integrated Circuits and Systems, vol. 20, No. 8, Aug. 2001, pp. 1016-1033.*

(Continued)

*Primary Examiner*—Phallaka Kik
(74) *Attorney, Agent, or Firm*—Jonathan T. Kaplan

(57) ABSTRACT

Relates to automatic conversion of assumption constraints, used in circuit design verification, that model an environment for testing a DUT/DUV, where the assumptions specify sequential behavior. Such assumptions are converted, with the use of logic synthesis tools, into a gate-level representation. For formal verification, a verification output is constructed from the gate-level representation and DUT/DUV assertion-monitoring circuitry. A formal verifier seeks to prove the verification output cannot indicate a design error. For simulation verification, the gate-level representation is converted into a hybrid representation comprising pipelines and combinational constraints. During simulation, the pipelines hold state information necessary for a solution, of the combinational constraints, to be in accord with the sequential assumption constraints. For certain sequential assumption constraints, the combinational constraints are insufficient to insure avoidance of deadend states. In a deadend state, an assumption is violated. A method is presented for augmenting the combinational constraints to avoid deadend states.

17 Claims, 10 Drawing Sheets

U.S. PATENT DOCUMENTS

| | | | |
|---|---|---|---|
| 6,732,346 B1* | 5/2004 | Horne et al. | 716/12 |
| 6,785,875 B1* | 8/2004 | Beerel et al. | 716/6 |
| 6,928,630 B1* | 8/2005 | Moon et al. | 716/6 |
| 2002/0055829 A1* | 5/2002 | Rajan | 703/17 |
| 2002/0178428 A1* | 11/2002 | Horne et al. | 716/12 |
| 2003/0120474 A1* | 6/2003 | Moon et al. | 703/19 |
| 2003/0121013 A1* | 6/2003 | Moon et al. | 716/6 |
| 2003/0196182 A1* | 10/2003 | Hahn | 716/6 |
| 2004/0034844 A1* | 2/2004 | Beerel et al. | 716/18 |

OTHER PUBLICATIONS

Miller et al., "A Transformation Based Algorithm for Reversable Logic Synthesis", Proceedings of Design Automation Conference, Jun. 2, 2003, pp. 318-323.*

Gopalakrishnan et al., "Power Optimisation of Combinational Circuits by Input Transformations", IEE Proceedings on Computers and Digital Techniques, vol. 150, No. 3, May 19, 2003, pp. 133-142.*

* cited by examiner

METHOD AND APPARATUS FOR SOLVING SEQUENTIAL CONSTRAINTS

FIELD OF THE INVENTION

The present invention relates generally to the solution of sets of constraints, and more particularly to the solution of sets of constraints containing at least one sequential constraint, in connection with design verification.

BACKGROUND OF THE INVENTION

To tackle the increasing complexity of integrated digital electronic circuits, designers need faster and more accurate methods for verifying the functionality and timing of such circuits, particularly in light of the need for ever-shrinking product development times.

The complexity of designing such circuits is often handled by expressing the design in a high-level hardware description language (HLHDL). The HLHDL description is then converted into a physical circuit specification through processes, well known to those of ordinary skill in the art as "synthesis," involving translation and optimization. Examples of an HLHDL are:

1. IEEE Standard 1364-2001, for the Verilog Hardware Description Language. The Institute of Electrical and Electronics Engineers, Inc., 345 East $47^{th}$ Street, New York, N.Y. 10017-2394, USA.
2. IEEE Standard 1076-1993, for the VHDL Hardware Description Language. ISBN: 1559373768, August 1994. The Institute of Electrical and Electronics Engineers, Inc., 345 East $47^{th}$ Street, New York, N.Y. 10017-2394, USA.

Once the HLHDL design has been created, it needs to be verified, and such HLHDL design can be referred to as the design under test or the design under verification (referred to herein as a "DUT/DUV").

An HLHDL description can be verified by simulation at the HLHDL level. In another approach, the HLHDL can be translated into a gate-level description that is then simulated, proven by formal methods or is subject to a hybrid combination of simulation and formal approaches.

Verification of an HLHDL description at relatively high-levels of design abstraction is important since detecting a circuit problem early prevents the expenditure of valuable designer time on achieving an efficient physical implementation for a design which, at a higher level, will not achieve its intended purpose. In addition, simulation of the DUT/DUV can be accomplished much more quickly at higher levels of representation than after the DUT/DUV has been translated into a lower-level, more circuit-oriented implementation. For the formal approach, combinatorial "explosion" is a major problem and therefore applying such methods to higher abstraction levels tends to allow them to address a larger portion of the DUT/DUV.

The verification of HLHDL descriptions has been aided by Hardware Verification Languages (or HVLs). An HVL can be implemented and supported by a test-bench automation (TBA) tool. Among other goals, HVLs can provide programming constructs and capabilities more closely matched to the task of verification of a DUT/DUV than are, for example, the HLHDL of the DUT/DUV itself or software-oriented programming languages (such as C or C++).

HVLs can include a programming mechanism by which to specify declarative constraints on a set of variables. Such declarative constraints can be easier to specify than a procedural approach. Uses of declarative constraints can include the following:
  i) declaration of "assertions" that specify properties the DUT/DUV must exhibit in order to be regarded as operating correctly; and
  ii) declaration of "assumptions" that specify properties the environment of the DUT/DUV must exhibit.

A DUT/DUV is typically designed such that correct operation is only assured if its environment satisfies a certain set of assumptions that have been input to the verification system as a model of the environment.

In the context of simulation-based verification, an environment that operates according to a set of assumption constraints can be achieved by solving the assumption constraints during the simulation process. In this case, terms of the assumption constraints whose values can be changed (i.e., are under the control of the environment), to find a solution to the environment's assumption constraints during a particular simulation cycle, are referred to as random variables (or RV's). Terms of the assumption constraints not under control of the environment (e.g., driven by the DUT/DUV) are referred to as state variables (or SV's).

In the context of formal verification, the objective is to exhaustively prove, provided the assumption constraints are not violated, that assertions about the DUT/DUV cannot be violated.

It is known how to automatically implement a verification environment, for testing a DUT/DUV, from declarative combinational assumption constraints (or simply "combinational assumption constraints").

However, combinational assumption constraints cannot specify a time-ordered behavior for an environment since combinational constraints specify assignment of values solely as a functional (or memory less) response to a current state of the various types of inputs that may be applied to it.

It is also known how to automatically implement declarative combinational or sequential assertion constraints. For verification by either formal methods or simulation, such combinational or sequential constraints can be converted, by logic synthesis tools, into an additional circuit, referred to as a "monitor," that is connected to the DUT/DUV and that asserts an "assertion error" output if an assertion is violated.

It would be desirable to be able to automatically implement a verification environment, for testing a DUT/DUV, from an input set of assumptions that includes declarative sequential assumption constraints (or simply "sequential assumption constraints").

SUMMARY OF THE INVENTION

1. Summary of Conversion of Sequential Constraints

The present invention comprises techniques for automatically converting a set of assumption constraints, that includes sequential assumption constraints, into a representation of an environment that tests a DUT/DUV.

Such sequential assumption constraints can be specified in a property language. While the process description herein is focused on the conversion of the sequential constraints, of an input set of assumption constraints that model an environment, it should be understood that the input set of assumption constraints can include combinational assumption constraints.

Below is described a process for automatic conversion of sequential assumption constraints, into a representation of an environment that tests a DUT/DUV, in terms of a first step and a second step.

1.1 Summary of First Step

In a first step, the sequential assumption constraints are converted, with the use of logic synthesis tools, into a gate-level representation that could serve as a monitor of the environment. This gate-level representation for the sequential assumption constraints (referred to herein as the "gate-level assumption representation") can include the following:

i) register pipelines (referred to herein as "assumption pipelines") that model the time-dependent properties of the sequential constraints to be converted; and ii) combinational gates (referred to herein as "assumption gates") that drive an output (referred to herein as an "assumption error output") indicating that an error in the assumptions has occurred.

Combinational assumption constraints, if included within an input set of assumption constraints for modeling an environment, just require the assumption gates aspect of the gate-level assumption representation.

Two logic synthesis tools can be used to produce the gate-level assumption representation:

i) A "sequential-constraints-to-HLDL compiler," that converts a language with sequential declarative constraints into a monitor in an HLHDL. When such compiler encounters a sequential delay operator, it implements the sequential delay, in its output HLHDL, by producing a pipeline structure.

ii) An "HLDL-to-gate-level compiler," that converts an HLHDL into a gate level representation.

Once the DUT/DUV, assumptions and assertions are expressed in a common gate-level representation, such gate-level representations can be combined, for either simulation or formal methods, by a Gate-Level Merger process into a combined gate-level representation.

While the present description focuses upon all of the DUT/DUV, assumptions and assertions being converted into a gate-level representation, alternative approaches can be used. For example, the DUT/DUV can be simulated at the HLHDL (also referred to as RTL) level.

Furthermore, while the present description focuses upon a gate-level representation where the gates are single-bit operators, gate-level representations, where the gates comprise word-level operators, can be used.

1.2 Summary of Second Step

Upon completion of the first step, the conversion process can continue in one of two ways depending upon whether verification by formal methods, or by simulation, is desired.

For formal verification, a single "formal-verification-output" is constructed, that combines the assumption-error-detecting gate-level assumption representation produced in the first step with assertion-monitoring circuitry for the DUT/DUV. The entire combination, of DUT/DUV, assertion monitor, assumption monitor (environment) and circuitry that produces the formal-verification-output, is input to a formal verifier. Depending upon the construction of the circuitry that produces the formal-verification-output, the goal of the verifier is either to prove the formal-verification-output can never be Logic One (also referred to as a "true" value), or can never be Logic Zero (also referred to as a "false" value).

If it is desired to produce a formal-verification-output where the goal is to prove that it can never be Logic One, such formal-verification-output can be constructed such that it is Logic One if and only if an assertion is violated by the DUT/DUV (e.g., "assertion error" becomes Logic One) and it is not the case that the assumption constraints have ever been violated (e.g., "assumption error" is always Logic Zero). Assuring that assumption constraints have never been violated can be modeled by feeding assumption error through a recirculating latch circuit before it is ANDed with assertion error.

A variety of formal verifiers can be used.

If the gate-level assumption representation of the first step is to be used to generate test data for driving the DUT/DUV, in a simulation verification approach, the second step is to convert such gate-level assumption representation into a hybrid assumption representation that comprises:

i) the assumption pipelines as simulated circuit elements; and ii) combinational constraints, referred to herein as "equivalent combinational assumption constraints," whose solution by a conventional combinational constraint solver produces an output behavior for the environment that is in accord with the sequential assumption constraints.

During simulation, the assumption pipelines are simulated such that they hold, at any point in the simulation, state information necessary for a solution of the equivalent combinational assumption constraints to be in accord with the sequential assumption constraints. Also, during simulation, the equivalent combinational assumption constraints are solved and such solutions provide data, for driving inputs to the DUT/DUV, that is in accordance with the specified sequential assumption constraints.

Combinational assumption constraints, if included within an input set of assumption constraints for modeling an environment, can be implemented with just the equivalent combinational assumption constraints aspect of the hybrid assumption representation.

The equivalent combinational assumption constraints are formed from a set of gates, referred to herein as the "augmented assumption gates." The augmented assumption gates can be extracted by beginning at the assumption error output and finding a transitive fanin, where such fanin stops under either of two conditions: reaching a register output, reaching an input to the DUT/DUV. The transitive fanin does not stop upon reaching an output of the DUT/DUV and, therefore, such fanin continues until a register output, within the DUT/DUV, is reached. It is the fact that the transitive fanin does not stop at a DUT/DUV output that can cause the augmented assumption gates to contain additional gates in comparison to the assumption gates.

The augmented assumption gates can be translated into equivalent combinational assumption constraints, expressed in a symbolic form, as follows: each gate's functionality is replaced by an appropriate logical operator; an input to a gate, from an output of a register within the DUT/DUV, is replaced by a state variable whose value is determined by the value of its corresponding register output; and an input to a gate, connected to an input of the DUT/DUV, is converted into a random variable.

Another approach can be to translate the augmented assumption gates into a BDD by any one of several known methods. As with translation to symbolic form, an input to the BDD is a state variable where an input to a gate is connected to an output of a register within the DUT/DUV and an input to the BDD is an RV where an input to a gate is connected to an input of the DUT/DUV. Such BDD can then be input to a BDD constraint solver. If such BDD constraint solver seeks solutions where all of its BDD constraints are true, the BDD result of translating the augmented assumption gates may be input to the constraint solver in complemented form.

Solving such equivalent combinational assumption constraints, in the course of a simulation, causes values to be assigned to their random variables that conform with the time-sequence-dependent rules of the input sequential assumption constraints.

2. Summary of Conversion With Deadend Avoidance

For certain sets of sequential assumption constraints, the equivalent combinational assumption constraints determined for them, as described above, are not sufficient to insure the random variables are always assigned with values that conform with the time-sequence-dependent nature of the sequential assumption constraints.

A state of the environment, in which at least one of the input assumption constraints that model the environment is violated, is referred to herein as a "deadend" state.

Presented herein is a method for identifying deadend states and for augmenting the equivalent combinational assumption constraint set such that transitions into deadend states are avoided. In the following presentation, the same symbol is used to denote both a set and its Boolean characteristic function.

2.1 Summary of Fail Function

A "fail function" $F(\hat{s},\hat{x})$ is determined, from the assumption gates, where $\hat{s}$ is a state of the assumption pipeline and $\hat{x}$ is the set of all inputs to the gate-level assumption representation. $F(\hat{s},\hat{x})$ returns a Logic One if and only if the input $\hat{s}$ and $\hat{x}$ would produce an invalid transition.

2.2 Summary of Deadend States Set

The set of deadend states, $D_0$, can be expressed in terms of $F(\hat{s},\hat{x})$ as follows:

$$D_0 = \{\hat{s} | \forall_{\hat{x}} F(\hat{s},\hat{x}) = 1\}$$

Thus, deadend states are those states that, for all possible input combinations, have no legal transitions. Since $\hat{x}$ is universally quantified out of $F(\hat{s},\hat{x})$, $D_0$ is solely in terms of $\hat{s}$. Therefore, the corresponding Boolean characteristic function $D_0(\hat{s})$, of the set $D_0$, returns Logic One only when given a deadend state as an argument.

2.3 Summary of Augmented Deadend States Set

This section discusses production of an augmented deadend states set. If the DUT/DUV has a signal that drives the environment, and is therefore not under the environment's control, it may be desirable to determine a strongly augmented deadend states set. Determination of such strongly augmented deadend states set is discussed further below. Regardless of whether an augmented or strongly augmented deadend states set is determined, the remaining steps for deadend state avoidance are the same.

Augmenting $D_0$ means adding to it all those states that, while having at least one valid transition, lead inexorably to a deadend state. This set, referred to as $D(\hat{s})$, can be determined as a stepwise, backward, fixed-point determination. The term "fixed-point determination," as used herein, is also known as a "fixed-point computation" or "fixpoint computation." In mathematical set notation, the fixed-point determination can be expressed as follows:

$$D_{k+1}(\hat{s}) = D_k(\hat{s}) \cup \{\hat{s} | \forall_{\hat{x}} \exists_{\hat{s}'} N(\hat{s},\hat{x},\hat{s}') == 1 \&\& (D_k(\hat{s})|_{\hat{s} \to \hat{s}'}) == 1\}$$

Where $N(\hat{s},\hat{x},\hat{s}')$ is a characteristic function, of a state transition relation, that is defined to return Logic One when, for a particular assumption environment, a present state of $\hat{s}$ and an input of $\hat{x}$ leads to a next state of $\hat{s}'$.

$N(\hat{s},\hat{x},\hat{s}')$ can be formed as follows from a particular gate-level assumption representation. For each register bit of $\hat{s}'$, the logic gate network of its transitive fanin, terminating at a register bit-line of $\hat{s}$ or an input bit-line of $\hat{x}$, is determined. The logic network is converted into an equivalent Boolean logic expression that is then equated with the register bit of $\hat{s}'$. For all bits in $\hat{s}'$, the equations are ANDed together to form $N(\hat{s},\hat{x},\hat{s}')$.

The above formula can be used with $D_k(\hat{s})$ initially set to $D_0$, and is iteratively applied as long as the value for a $D_{k+1}(\hat{s})$ is not equal to the value for a $D_k(\hat{s})$.

2.4 Summary of Reachable States Set

While the above procedure results in a set $D(\hat{s})$ containing all states that are either deadend states, or that lead inevitably to deadend states, some of the states in $D(\hat{s})$ may not be reachable from the initial states of the environment. With $R_0(\hat{s})$ defined as the set of initial states of the environment, we define a set $R_{k+1}(\hat{s})$ to be the set of all states reachable in one transition from $R_k(\hat{s})$ and $R(\hat{s})$ to be the set of all states reachable from $R_0(\hat{s})$. $R_0(\hat{s})$ is defined as the set of initial states of the environment monitor, that can be, for example, the state in which all registers of the monitor contain zero.

$R(\hat{s})$ can be determined as a stepwise, forward, fixed-point determination. In mathematical set notation, this fixed-point determination can be expressed as follows:

$$R_{k+1}(\hat{s}) = R_k(\hat{s}) \cup \{\hat{s}' | (\exists_{\hat{s}} \exists_{\hat{x}} N(\hat{s},\hat{x},\hat{s}') == 1 \&\& R_k(\hat{s}) == 1)|_{\hat{s} \to \hat{s}'}\}$$

As can be seen above, the right-hand-side expression to the union operator provides a state $\hat{s}'$ for extending $R_k(\hat{s})$ if there exists an input $\hat{x}$ and a state $\hat{s}$, where $\hat{s}$ is a member of $R_k(\hat{s})$, such that $\hat{s}$, $\hat{x}$ and $\hat{s}'$ are a valid transition.

The above formula can be used with $R_k(\hat{s})$ initially set to $R_0(\hat{s})$, and is iteratively applied as long as the value for a $R_{k+1}(\hat{s})$ is not equal to the value for a $R_k(\hat{s})$.

2.5 Summary of Reachable Deadend States Set

The set of reachable deadend states, referred to as $RD(\hat{s})$, is the intersection of the sets $R(\hat{s})$ and $D(\hat{s})$.

2.6 Summary of Fail Function Augmented for Deadend Avoidance

An augmented fail function "F" with deadend avoidance, referred to as $F^{da}$, can be determined from the above determined relation $N(\hat{s},\hat{x},\hat{s}')$ and set $RD(\hat{s})$. Determination of $F^{da}$ can be described as follows:

$$F^{da}(\hat{s},\hat{x}) = \exists_{\hat{s}'} \{N(\hat{s},\hat{x},\hat{s}') == 1 \&\& (RD(\hat{s})|_{\hat{s} \to \hat{s}'}) == 1\}$$

$F^{da}(\hat{s},\hat{x})$ contains the set of present state and input pairs such that there exists a next state, but the next state is either a deadend state or leads inexorably to a deadend state.

2.7 Summary of Augmented Equivalent Combinational Assumption Constraints $F^{da}(\hat{s},\hat{x})$ can be used to form the following constraint, that augments the equivalent combinational assumption constraints:

$$F^{da}(\hat{s},\hat{x}) == 0$$

Depending upon the constraint solver, an alternate format, for the constraint that augments the equivalent combinational assumption constraints, is as follows. The objective, with the following format, is to find solutions that make the expression return a Logic One:

$$!F^{da}(\hat{s},\hat{x})$$

3. Summary of Conversion With Strong Deadend Avoidance

The above method for deadend avoidance is sufficient if the environment receives no inputs from the DUT/DUV.

However, if the environment is subject to variables not under its control, stronger deadend avoidance constraints may be needed.

In this case, the deadend avoidance method of above can have its augmented deadend states set determined as follows:

$$D_{k+1}(\hat{s}) = D_k(\hat{s}) \cup \{\hat{s} | \exists_{xout} \forall_{xin} \exists_{\hat{s}'} N(\hat{s}, xout, xin, \hat{s}') ==1 \&\& (D_k(\hat{s})|_{\hat{s} \to \hat{s}'}) ==1\}$$

Where $N(\hat{s}, xout, xin, \hat{s}')$ differs from $N(\hat{s}, \hat{x}, \hat{s}')$ by splitting the $\hat{x}$ into two parts: "xout," which are outputs of the DUT/DUV; and "xin" which are inputs to the DUT/DUV. The distinction is significant since the "xin" signals are under direct control of the environment while the "xout" signals are not. The above equation is stating that even if there is only one combination of "xout" signals that would cause a transition to a state already a member of a $D_k(\hat{s})$, the $\hat{s}$ should be included in $D_{k+1}(\hat{s})$.

BRIEF DESCRIPTION OF THE DRAWINGS

The accompanying drawings, that are incorporated in and constitute a part of this specification, illustrate several embodiments of the invention and, together with the description, serve to explain the principles of the invention.

DETAILED DESCRIPTION OF PREFERRED EMBODIMENTS

Reference will now be made in detail to preferred embodiments of the invention, examples of which are illustrated in the accompanying drawings. Wherever possible, the same reference numbers will be used throughout the drawings to refer to the same or like parts.

This specification contains pseudo-code to illustrate several embodiments of the invention and to explain its principles. The pseudo-code is loosely based upon the C and C++ programming languages. The C and C++ programming languages are described in such texts as "The C Programming Language", by B. W. Kernighan and D. M. Ritchie, Prentice Hall, Inc., 1988, ISBN 0-13-110362-8 (paperback), 0-13-110370-9 (hardback) and "The C++ Programming Language," by Bjarne Stroustrup, Addison-Wesley Pub. Co., 3rd edition, July 1997, ISBN 0-2018-8954-4, which are herein incorporated by reference.

Table of Contents to Detailed Description

1. Conversion of Sequential Constraints
   1.1 First Step
   1.2 Second Step
      1.2.1 Formal Verification
      1.2.2 Simulation Verification
2. Conversion With Deadend Avoidance
   2.1 Fail Function
   2.2 Deadend States Set
   2.3 Augmented Deadend States Set
   2.4 Reachable States Set
   2.5 Reachable Deadend States Set
   2.6 Fail Function Augmented for Deadend Avoidance
   2.7 Augmented Equivalent Combinational Assumption Constraints
3. Conversion With Strong Deadend Avoidance
4. Symbolic Example of Deadend State Avoidance
   4.1 Fail Function
   4.2 Deadend States Set
   4.3 Augmented Deadend States Set
   4.4 Reachable States Set
   4.5 Reachable Deadend States Set
   4.6 Fail Function Augmented for Deadend Avoidance
   4.7 Augmented Equivalent Combinational Assumption Constraints
5. Symbolic Example of Strong Deadend State Avoidance
6. Hardware Environment 1. Conversion of Sequential Constraints The present invention comprises techniques for automatically converting sequential assumption constraints into a representation of an environment that tests a DUT/DUV. While the process description herein is focused on the conversion of the sequential constraints, of an input set of assumption constraints that model an environment, it should be understood that the input set of assumption constraints can include combinational assumption constraints.

Sequential assumption constraints can be specified in a property language, such as:
  i) Open Vera Assertion language (or OVA), Synopsys, Inc., Mountain View, Calif., USA;
  ii) PSL (see Y. Abarbanel, I. Beer, L. Gluhovsky, S. Keidar, Y. Wolfsthal. "FoCs—Automatic generation of simulation checkers from formal specifications," In Proceedings of CAV, 2000); and
  iii) SVA (see SystemVerilog 3.1, Accellera's Extensions to Verilog, June 2003).

Figure 1:
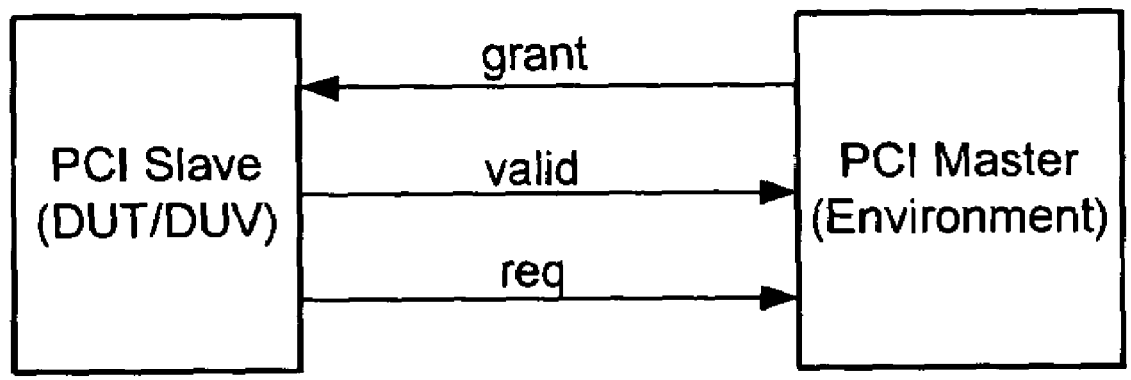
FIG. 1 depicts a first example verification system, comprising a combination of a DUT/DUV and environment, to illustrate production of a gate-level assumption representation.

The present invention operates as follows and will be explicated with the assistance of a first example verification system as shown in FIG. 1.

FIG. 1 depicts a block called "PCI Slave" (which is, for purposes of this example, the DUT/DUV) and another block called "PCI master" (which is, for purposes of this example, the environment).

An informal, sequential assumption constraint oriented, description of the operation of the environment of FIG. 1 is as follows: if the DUT/DUV asserts the "req" line of the environment on one clock cycle, and the DUT/DUV asserts the "valid" line of environment one clock cycle later, then, two clock cycles after "req" was initially asserted, the environment should assert "grant" line.

Such a sequential assumption constraint can be expressed in OVA as follows:

event e1: req==1 #1 valid==1;
event e2: if (ended e1) then #1 (grant==1);
assume a: check(e2);

Sequential delay can be represented in OVA by the "#" sequential delay operator, and such operator is used in the above OVA example. An OVA event detects sequential conditions, and the ended operator detects the occurrence of an event. In the above OVA example, the event e2 specifies the sequential assumption constraint.

Figure 7A:
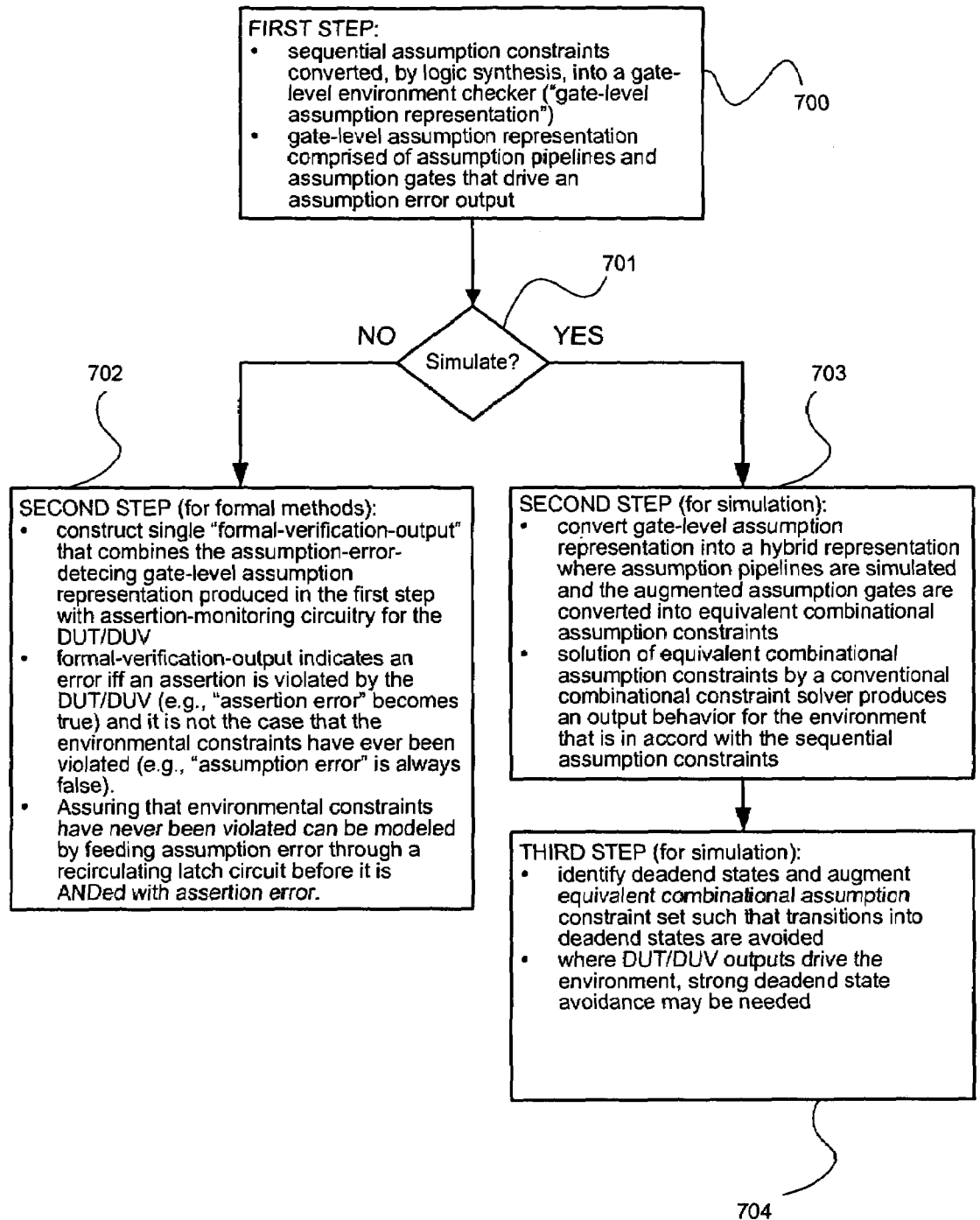
FIGS. 7A–7B depict processes for conversion of sequential assumption constraints for purposes of DUT/DUV verification.

Below is described a process for automatic conversion of sequential assumption constraints, into a representation of an environment that tests a DUT/DUV, in terms of a first step and a second step. Such first step and second step are also depicted in FIG. 7A.

Figure 8:
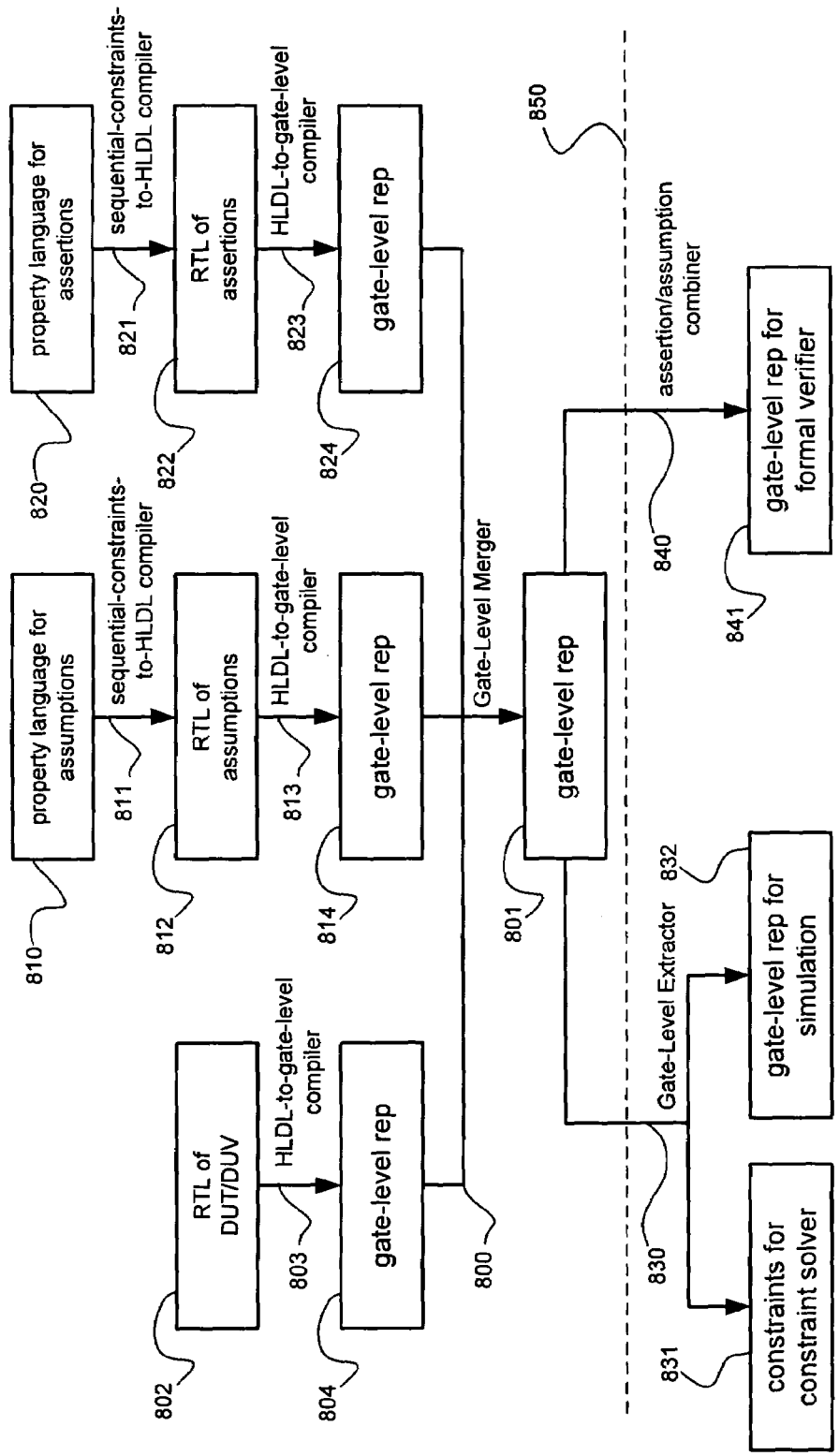
FIG. 8 depicts an overall verification process that includes the conversion of sequential assumption constraints for purposes of DUT/DUV verification.

An overall view of the preparation of a circuit model for the verification process, that includes processing of the DUT/DUV, as well as of the assertions, is shown in FIG. 8. FIG. 8 comprises boxes representing data representations produced and/or utilized at various steps in a process, with such boxes connected by arrows representing processes that utilize and produce data representations. FIG. 8 is divided into upper and lower halves by a dashed line 850. The portion above dashed line 850 (whose components are numbered in the range 800 to 824) corresponds to the first step, while the portion below the dashed line 850 (whose components are numbered in the range 830 to 840) corresponds to the second step.

1.1 First Step

In a first step (see step 700 of FIG. 7A), the sequential assumption constraints are converted, with the use of logic synthesis tools, into a gate-level representation that could serve as a monitor of the environment. This gate-level representation for the sequential assumption constraints (referred to herein as the "gate-level assumption representation") can include the following:

i) register pipelines (referred to herein as "assumption pipelines") that model the time-dependent properties of the sequential constraints to be converted; and ii) combinational gates (referred to herein as "assumption gates") that drive an output (referred to herein as an "assumption error output") indicating that an error in the assumptions has occurred. The assumption gates can be dependent on any combination of the following: state bits of the assumption pipelines, inputs to the DUT/DUV, outputs of the DUT/DUV, inputs to the environment, outputs of the environment.

The assumption gates can be identified by beginning at the assumption error output and finding a transitive fanin, where such fanin stops under any of three conditions: reaching a register output of the assumption pipelines, reaching an input to the DUT/DUV, or reaching an output of the DUT/DUV.

Combinational assumption constraints, if included within an input set of assumption constraints for modeling an environment, just require the assumption gates aspect of the gate-level assumption representation.

In the case of constraints written in OVA, two logic synthesis tools can be used to produce the gate-level assumption representation: OVA Compiler of Synopsys, Inc. and Design Compiler of Synopsys, Inc. More generally, two logic synthesis tools for performing the first step are:

i) A "sequential-constraints-to-HLDL compiler," that converts a language with sequential declarative constraints into a monitor in a High-Level Hardware Design Language (HLHDL), such as Verilog or VHDL. When such compiler encounters a sequential delay operator, it implements the sequential delay, in its output HLHDL, by producing a pipeline structure.

ii) An "HLDL-to-gate-level compiler," that converts an HLHDL into a gate level representation. The compiler utilized need not include some or all of the optimization procedures, typically associated with HLHDL to gate-level compilers, since sub-optimal logic designs, with respect to a circuit implementation, can still be suitable for the automatic conversion of sequential constraints for purposes of design verification. An advantage of not utilizing such optimization procedures, when an HLDL-to-gate-level compiler is utilized for automatic conversion of sequential constraints, is a greater speed of conversion.

In the case of OVA constraints, they can be converted, by OVA Compiler, into Verilog or VHDL. For the OVA statement, of the first example verification system, an example conversion into Verilog is as follows:

```
assign err <= valid_pre_req && !grant;
always @(posedge clk or posedge reset) begin
    /* the non-blocking assignment operators, "<=," of a
       begin-end block execute simultaneously */
    If(reset) begin
            pre_req <= 0;
            valid_pre_req <= 0;
        end
    else begin
            pre_req <= req; /* use pre_req as register to record
                passage of a cycle */
            valid_pre_req <= pre_req && valid;
        end
end
```

The HLHDL produced by OVA Compiler can be converted into a gate-level assumption representation by Design Compiler, or by a version of Design Compiler from which some or all of its optimization procedures, for a circuit implementation, have been removed.

Figure 2:
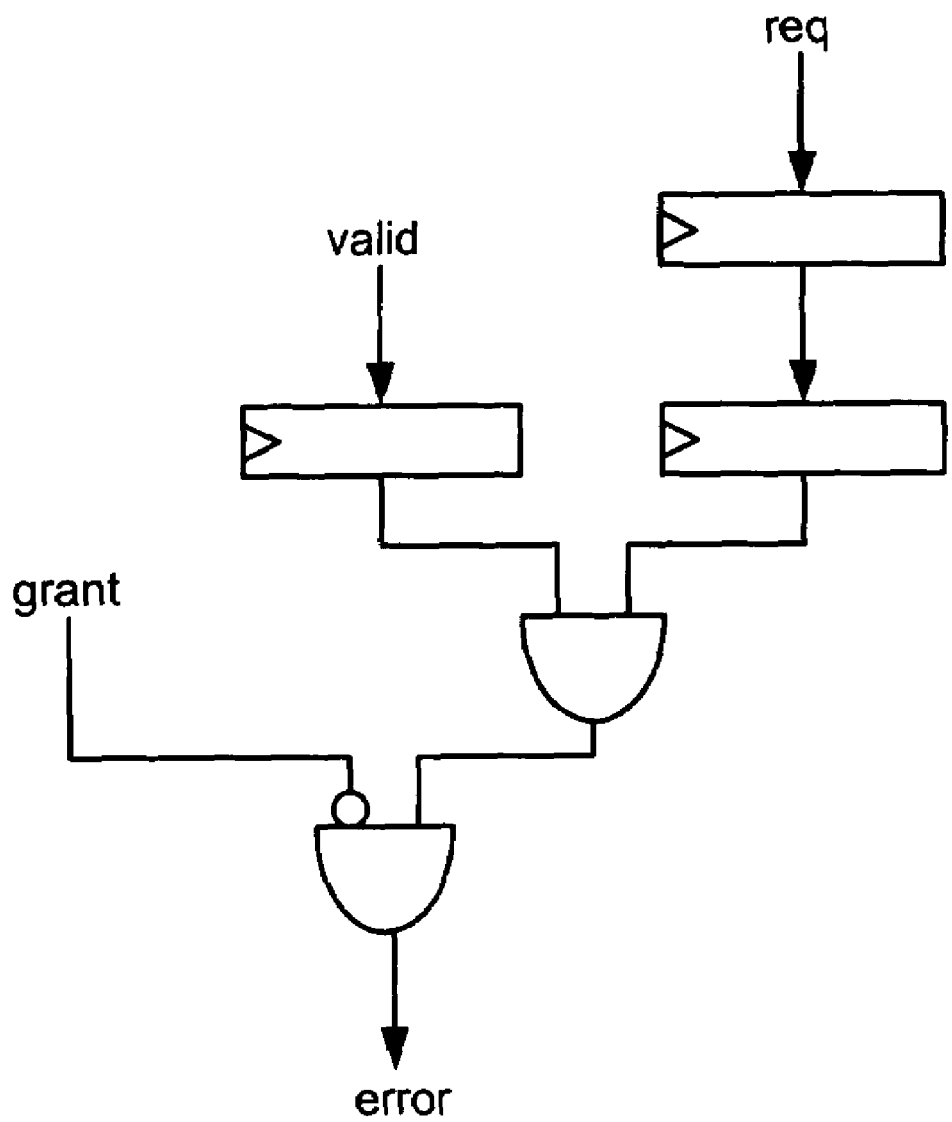
FIG. 2 depicts an example gate-level assumption representation for a monitor of the environment of FIG. 1.
Figure 3:
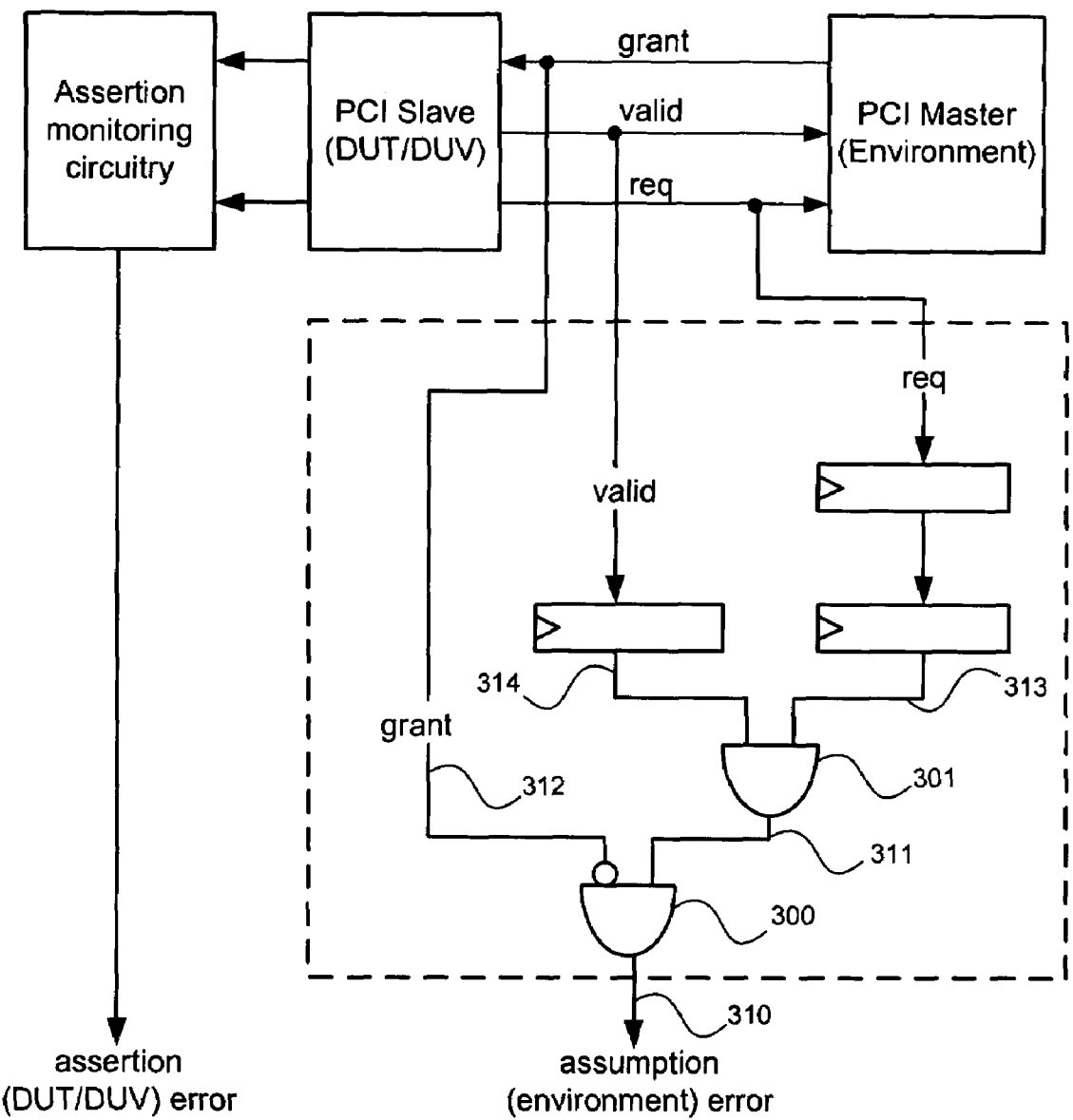
FIG. 3 depicts the first example verification system of FIG. 1, to which has been added the environment monitor of FIG. 2 along with an assertion monitor for the DUT/DUV.

For the just-above-listed example Verilog, an example gate-level assumption representation is shown in FIG. 2. FIG. 3 depicts such gate-level assumption representation of FIG. 2 in dashed outline, and connected to the first example verification system of FIG. 1 as it would be if such gate-level assumption representation were being used as an assertion monitor of the environment. FIG. 3 also adds, to the first example verification system, assertion monitoring circuitry for the DUT/DUV.

FIG. 8 depicts the above-described first step in the context of an overall verification system. Conversion of a property language description of assumptions into a gate-level representation is depicted by those parts of the figure labeled 810 to 814. A similar process, represented in FIG. 8 by those parts of the diagram labeled 820 to 824, can be used to convert property language description of assertions into a gate-level representation. For the DUT/DUV, FIG. 8 depicts (by those parts of the diagram labeled 802 to 804) conversion of an HLHDL description (802) into a gate-level representation (804) by an HLDL-to-gate-level compiler process (803). FIG. 8 refers to HLHDL representations (in boxes 802, 812 and 822) as register-transfer level (or RTL) representations. Once the DUT/DUV, assumptions and assertions are expressed in a common gate-level representation (indicated by boxes 804, 814 and 824), such gate-level representations can be combined, for either simulation or formal methods, by a Gate-Level Merger process (800) into a combined gate-level representation (801).

While FIG. 8 depicts all of the DUT/DUV, assumptions and assertions being converted into a gate-level representation, alternative approaches can be used. For example, the DUT/DUV can be simulated at the HLHDL (also referred to as RTL) level.

Furthermore, while the present description focuses upon a gate-level representation where the gates are single-bit operators, gate-level representations, where the gates comprise word-level operators, can be used.

1.2 Second Step

Upon completion of the first step, the conversion process can continue in one of two ways (see decision point 701 of FIG. 7A), depending upon whether verification by formal methods, or by simulation, is desired.

1.2.1 Formal Verification

For formal verification (see second step 702 of FIG. 7A), a single "formal-verification-output" is constructed, that combines the assumption-error-detecting gate-level assumption representation produced in the first step with assertion-monitoring circuitry for the DUT/DUV. The entire combination, of DUT/DUV, assertion monitor, assumption monitor (environment) and circuitry that produces the formal-verification-output, is input to a formal verifier. Depending upon the construction of the circuitry that produces the formal-verification-output, the goal of the verifier is either to prove the formal-verification-output can never be Logic One (also referred to as a "true" value), or can never be Logic Zero (also referred to as a "false" value).

If it is desired to produce a formal-verification-output where the goal is to prove that it can never be Logic One, such formal-verification-output can be constructed such that it is Logic One if and only if an assertion is violated by the DUT/DUV (e.g., "assertion error" becomes Logic One) and it is not the case that the assumption constraints have ever been violated (e.g., "assumption error" is always Logic Zero). Assuring that assumption constraints have never been violated can be modeled by feeding assumption error through a recirculating latch circuit before it is ANDed with assertion error.

Figure 4:
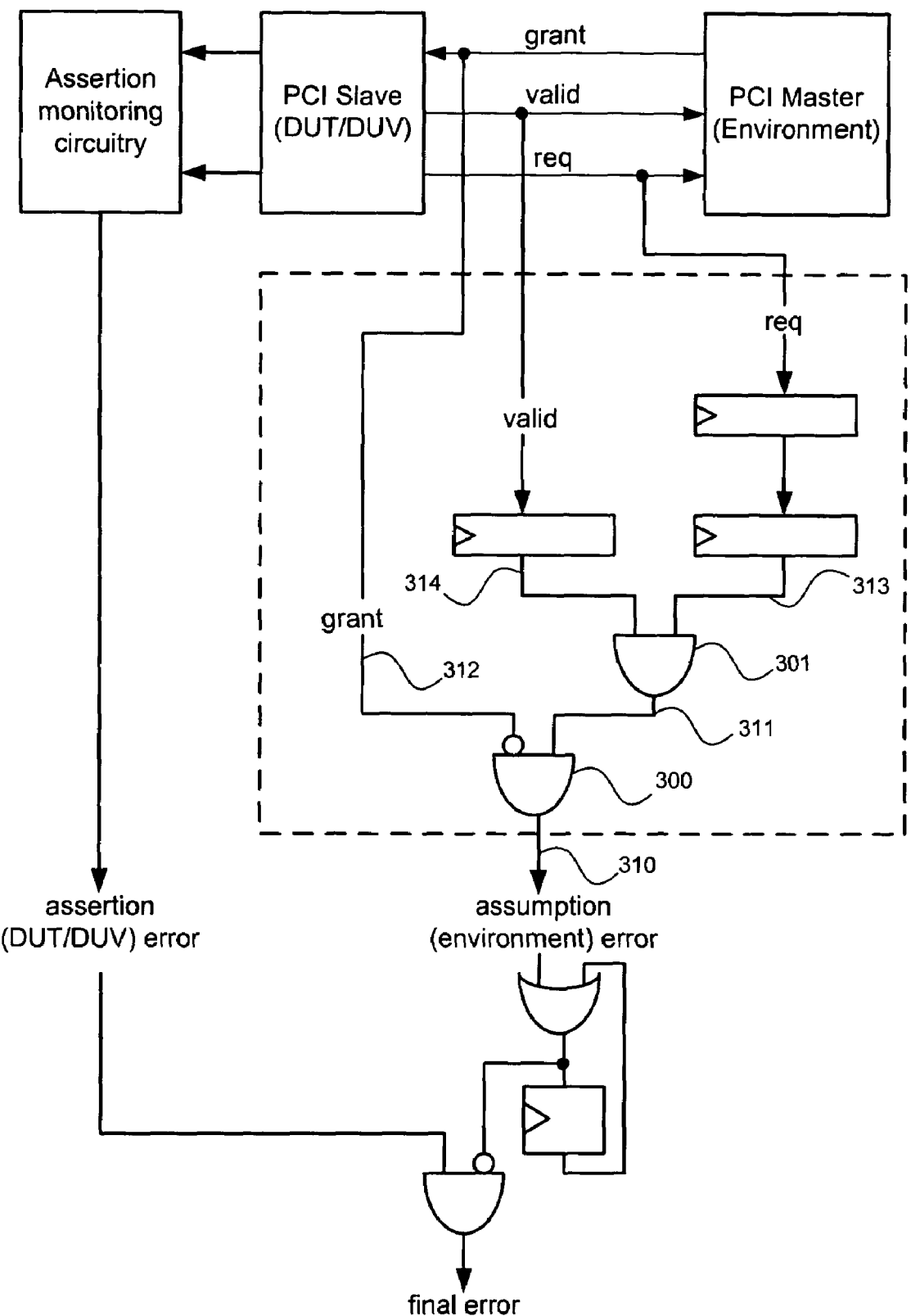
FIG. 4 depicts the combination of the assertion monitor and assumption monitor of FIG. 3 for purposes of formal verification.

An example gate-level circuit, that specifies a formal-verification-output output called "final error," is shown in FIG. 4. A design can be verified by proving that "final error" of FIG. 4 can never be Logic One. As can be seen, "assumption error" is connected to a recirculating latch configuration.

As can also be seen, "final error" is an AND of the "assertion error" output and the NOT of the recirculating latch output. If the formal verifier can prove that an "assertion error" can occur, while never violating an assumption constraint, then the DUT/DUV designer needs to be notified by asserting the "final error" output.

A variety of formal verifiers can be used. An example suitable formal verifier is presented in the following paper: "Formal Property Verification by Abstraction Refinement with Formal, Simulation and Hybrid Engine," by D. Wang, P-H. Ho, J. Long, J. Kukula, Y. Zhu, T. Ma and R. Damiano, Proceedings of the Design Automation Conference, Jun. 18–22, 2001, Las Vegas, Nev., USA, pages 35–40. Formal verifiers, also referred to as symbolic model checkers, are also provided by the following companies: Real Intent, Inc., Santa Clara, Calif.; Jasper Design Automation, Inc., Mountain View, Calif.; and International Business Machines Corporation, Armonk, N.Y., with its "RuleBase Formal Verification Tool."

In FIG. 8, such second step for formal verification is depicted by an assertion/assumption combiner process (840) and the resulting gate-level representation for formal verifier (841) that contains a single formal-verification-output.

1.2.2 Simulation Verification

If the gate-level assumption representation of the first step is to be used to generate test data for driving the DUT/DUV, in a simulation verification approach, the second step (see second step 703 of FIG. 7A) is to convert such gate-level assumption representation into a hybrid assumption representation that comprises:

i) the assumption pipelines as simulated circuit elements; and ii) combinational constraints, referred to herein as "equivalent combinational assumption constraints," whose solution by a conventional combinational constraint solver produces an output behavior for the environment that is in accord with the sequential assumption constraints.

During simulation, the assumption pipelines are simulated such that they hold, at any point in the simulation, state information necessary for a solution of the equivalent combinational assumption constraints to be in accord with the sequential assumption constraints. Also, during simulation, the equivalent combinational assumption constraints are solved and such solutions provide data, for driving inputs to the DUT/DUV, that is in accordance with the specified sequential assumption constraints.

Combinational assumption constraints, if included within an input set of assumption constraints for modeling an environment, can be implemented with just the equivalent combinational assumption constraints aspect of the hybrid assumption representation.

The equivalent combinational assumption constraints are formed from a set of gates, referred to herein as the "augmented assumption gates." The augmented assumption gates can be extracted by beginning at the assumption error output and finding a transitive fanin, where such fanin stops under either of two conditions: reaching a register output, reaching an input to the DUT/DUV. The transitive fanin does not stop upon reaching an output of the DUT/DUV and, therefore, such fanin continues until a register output, within the DUT/DUV, is reached. It is the fact that the transitive fanin does not stop at a DUT/DUV output that can cause the augmented assumption gates to contain additional gates in comparison to the assumption gates.

For the example of FIG. 3, such transitive fanin extracts, as the augmented assumption gates, gates 300 and 301. If wire 312 of gate 300 were an output of the DUT/DUV, rather than the input shown, the transitive fanin would continue back into the internal circuitry of the DUT/DUV until its first layer of registers is reached.

The augmented assumption gates can be translated into equivalent combinational assumption constraints, expressed in a symbolic form, as follows: each gate's functionality is replaced by an appropriate logical operator; an input to a gate, from an output of a register within the DUT/DUV, is replaced by a state variable whose value is determined by the value of its corresponding register output; and an input to a gate, connected to an input of the DUT/DUV, is converted into a random variable.

Another approach can be to translate the augmented assumption gates into a BDD by any one of several known methods. As with translation to symbolic form, an input to the BDD is a state variable where an input to a gate is connected to an output of a register within the DUT/DUV and an input to the BDD is an RV where an input to a gate is connected to an input of the DUT/DUV. Such BDD can then be input to a BDD constraint solver. If such BDD constraint solver seeks solutions where all of its BDD constraints are true, the BDD result of translating the augmented assumption gates may be input to the constraint solver in complemented form.

Solving such equivalent combinational assumption constraints, in the course of a simulation, causes values to be assigned to their random variables that conform with the time-sequence-dependent rules of the input sequential assumption constraints (such as the example OVA rule shown above).

For the example of FIG. 3, the equivalent combinational assumption constraint solved is as follows:

$$313\&\&314\ \&\&\ (!grant)==0$$

For the above-listed constraint, 313 and 314 are state variables (or SV's), whose values are given by the simulation, while "grant" is the random variable (or RV) for which a combinational constraint solver finds acceptable values.

In FIG. 8, a second step for simulation verification is depicted by a Gate-Level Extractor process (830) that produces equivalent combinational assumption constraints (831) and a gate-level representation (832) for simulation.

2. Conversion With Deadend Avoidance

For certain sets of sequential assumption constraints, the equivalent combinational assumption constraints determined for them, as described above, are not sufficient to insure the random variables are always assigned with values that conform with the time-sequence-dependent nature of the sequential assumption constraints. A state of the environment, in which at least one of the input assumption constraints that model the environment is violated, is referred to herein as a "deadend" state.

Figure 5:
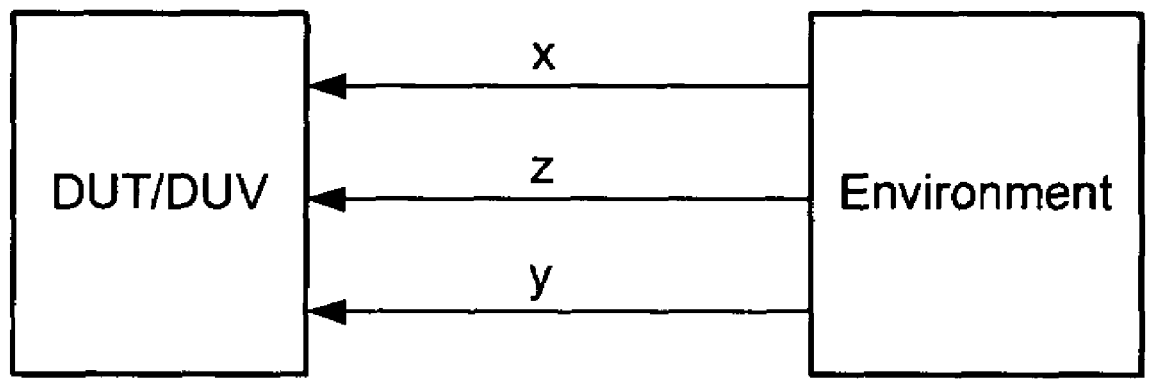
FIG. 5 depicts a second example verification system, comprising a combination of a DUT/DUV and environment, to illustrate deadend state avoidance.

The following is an example of such a sequential assumption constraint set written in OVA:

If ($x$==1) then (#2 $y$==1);

If ($z$==1) then (#1 $y$==0);

A second example verification system, having example connections between an environment operating according to the just-above OVA constraint set and a DUT/DUV, is shown in FIG. 5. Example Verilog, that can be generated for each of the above rules by OVA Compiler, is as follows:

```
/* Verilog for If (x==1) then (#2 y==1); */
assign err = pre_pre_x && !y;
always @(posedge clk or posedge reset) begin
    If(reset) begin
        pre_x <= 0;
        pre_pre_x <= 0;
    end
    else begin
        pre_x <= x;
        pre_pre_x <= pre_x ;
    end
end
/* Verilog for If (z==1) then (#1 y==0); */
assign err = pre_z && y;
always @(posedge clk or posedge reset) begin
    If(reset) begin
        pre_z <= 0;
```

```
    end
    else begin
        pre_z <= z;
    end
end
```

Figure 6:
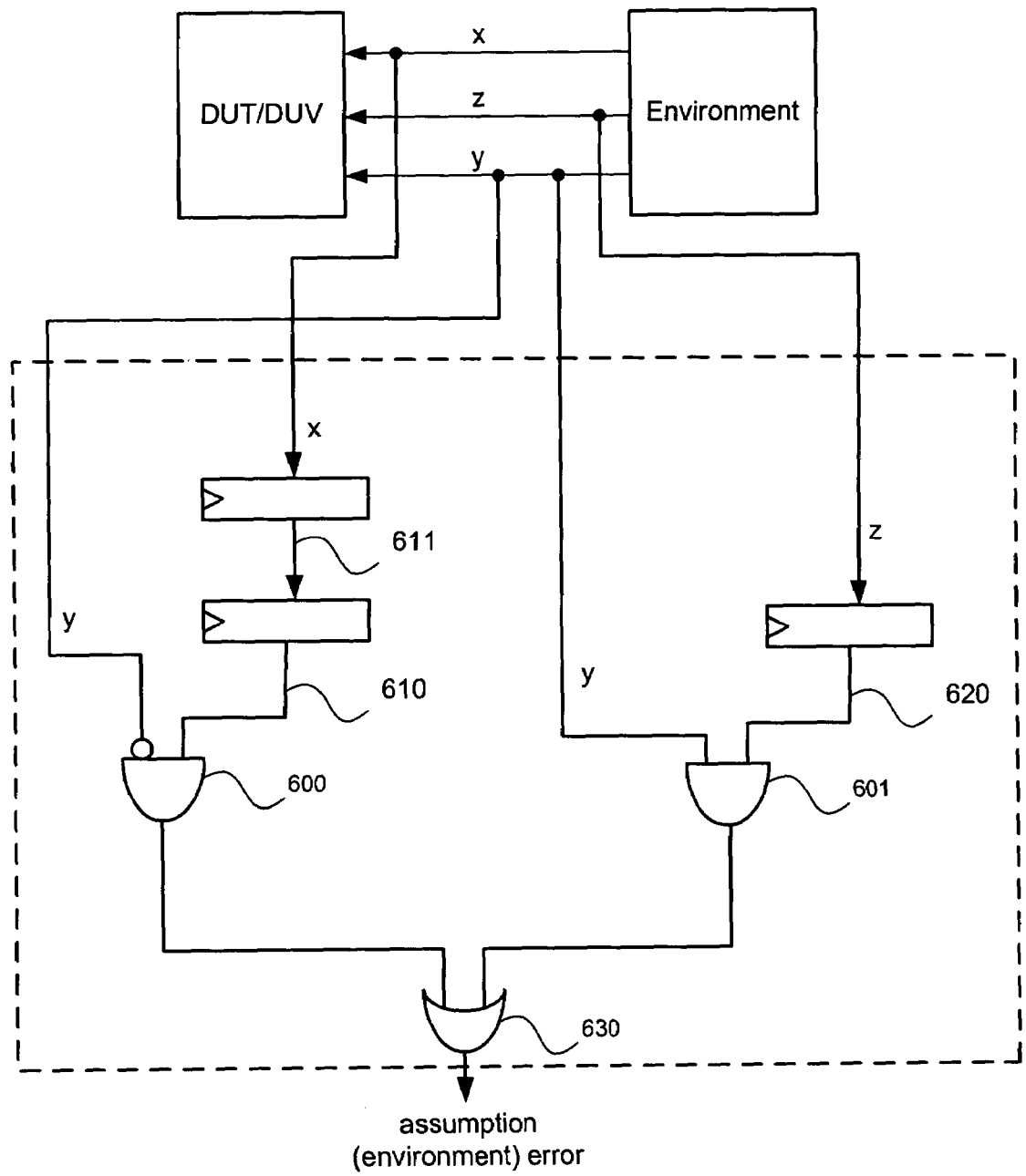
FIG. 6 depicts the second example verification system of FIG. 5, to which has been added an example gate-level assumption representation for a monitor of the environment of FIG. 5.

An example gate-level assumption representation, that can be generated for the above Verilog from Design Compiler, is depicted in dashed outline in FIG. 6. The gate-level assumption representation is shown connected to the second example verification system of FIG. 5 as it would be if such gate-level assumption representation were being used as an assertion monitor of the environment. An equivalent combinational assumption constraint, extracted from the example gate-level assumption representation, is as follows:

$$(!y\&\&610)||(y\&\&620)==0$$

Since, for this example, "x," "y," and "z" are all outputs of the environment, all of these variables become RV's for the constraint solver, but only "y" appears in the equivalent combinational assumption constraint. Therefore, there is no constraint in the equivalent combinational assumption constraint set preventing RV "z" from being assigned a value of Logic One, by the constraint solver, one cycle after RV "x" is assigned a Logic One value. Such time-ordered assignment of values to "x" and "z" results, however, in an insolvable conflict situation where, for either value of "y," the equivalent combinational assumption constraint is violated. Such a state, in which at least one equivalent combinational assumption constraint is violated, is referred to herein as a "deadend" state.

Figure 7B:
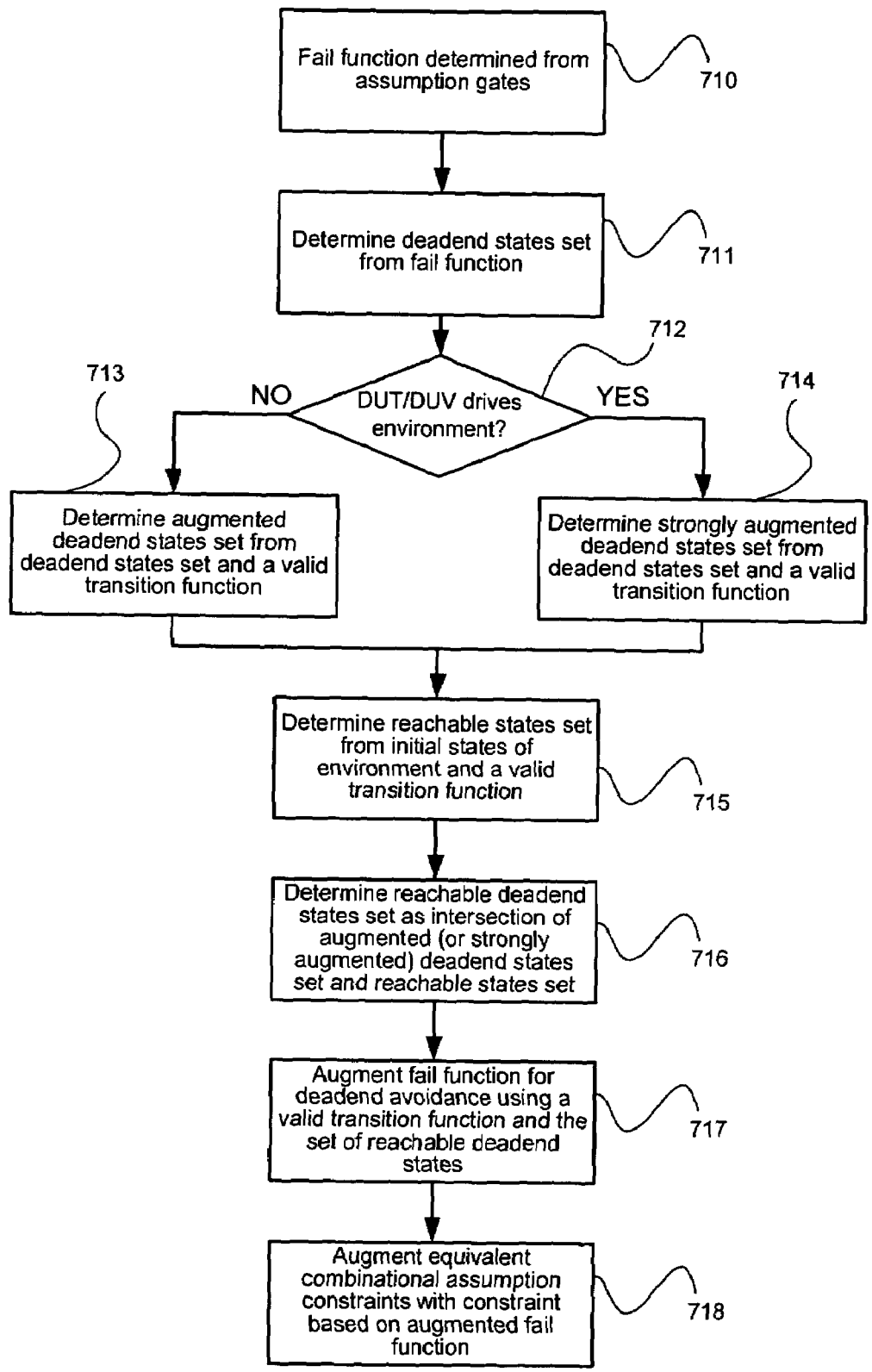

Presented herein is a method for identifying deadend states and for augmenting the equivalent combinational assumption constraint set such that transitions into deadend states are avoided (see FIG. 7B, which is an expansion of step 704 of FIG. 7A). Within the overall verification process of FIG. 8, such process for augmenting the equivalent combinational assumption constraint set is performed by the Gate-Level Extractor process (830).

2.1 Fail Function

A "fail function" $F(\hat{s},\hat{x})$ is determined, from the assumption gates, where $\hat{s}$ is a state of the assumption pipeline and $\hat{x}$ is the set of all inputs to the gate-level assumption representation (see step 710 of FIG. 7B). $F(\hat{s},\hat{x})$ returns a Logic One if and only if the input $\hat{s}$ and $\hat{x}$ would produce an invalid transition. For the second example verification system of FIG. 6, $\hat{s}$ is 610, 611 and 620, while $\hat{x}$ is "x," "y" and "z." The fail function for FIG. 6 is comprised of gates 600, 601 and 630 and can be represented symbolically as follows:

$$F(\hat{s},\hat{x})=(!y\&\&610)||(y\&\&620)$$

Since the assumptions for a DUT/DUV can be complex, in terms of the number of state bits and/or inputs, it can be desirable to express $F(\hat{s},\hat{x})$ in a compact representation, such as a binary decision diagram (BDD).

2.2 Deadend States Set

Using mathematical set notation, the set of deadend states, $D_0$, can be expressed in terms of $F(\hat{s},\hat{x})$ as follows (see step 711 of FIG. 7B):

$$D_0=\{\hat{s}|\forall_{\hat{x}}F(\hat{s},\hat{x})=1\}$$

Thus, deadend states are those states that, for all possible input combinations, have no legal transitions. Since $\hat{x}$ is universally quantified out of $F(\hat{s},\hat{x})$, $D_0$ is solely in terms of ŝ. Therefore, $D_0(ŝ)$ returns Logic One only when given a deadend state as an argument. In terms of pseudo-code, that processes BDDs, the determination of $D_0$ can be expressed as follows:

$D = BDD\_FORALL(a\_inputs, F(a\_states, a\_inputs))$

Where "BDD_FORALL" is a two-argument function that performs universal quantification, "a_inputs" corresponds to $x̂$, "a_states" corresponds to ŝ and F(a_states,a_inputs) corresponds to $F(ŝ,x̂)$. BDD_FORALL universally quantifies, from the function F(a_states, a_inputs), the set of inputs specified by a_inputs.

2.3 Augmented Deadend States Set

This section discusses production of an augmented deadend states set (see step 713 of FIG. 7B). If the DUT/DUV has a signal that drives the environment ("yes" path of decision point 712 of FIG. 7B), and is therefore not under the environment's control, it may be desirable to determine a strongly augmented deadend states set (see step 714 of FIG. 7B). Determination of such strongly augmented deadend states set is covered below in Section 3. As can be seen from FIG. 7B, regardless of whether an augmented or strongly augmented deadend states set is determined, the remaining steps for deadend state avoidance (see steps 715–718 of FIG. 7B) are the same.

Augmenting $D_0$ means adding to it all those states that, while having at least one valid transition, lead inexorably to a deadend state. This set, referred to as $D(ŝ)$, can be determined as a stepwise, backward, fixed-point determination. In mathematical set notation, the fixed-point determination can be expressed as follows:

$$D_{k+1}(ŝ) = D_k(ŝ) \cup \{ŝ | \forall x̂ \exists_{ŝ'} N(ŝ, x̂, ŝ') == 1 \&\& (D_k(ŝ))|_{ŝ \to ŝ'} == 1\}$$

Where $N(ŝ, x̂, ŝ')$ is a characteristic function, of a state transition relation, that is defined to return Logic One when, for a particular assumption environment, a present state of ŝ and an input of $x̂$ leads to a next state of ŝ'. As can be seen above, the right-hand-side expression to the union operator provides a state ŝ for extending $D_k(ŝ)$ if, for all inputs $x̂$, there exists a state ŝ', where ŝ' is a member of $D_k(ŝ)$, such that ŝ, $x̂$ and ŝ' are a valid transition.

$N(ŝ, x̂, ŝ')$ can be formed as follows from a particular gate-level assumption representation. For each register bit of ŝ', the logic gate network of its transitive fanin, terminating at a register bit-line of ŝ or an input bit-line of $x̂$, is determined. The logic network is converted into an equivalent Boolean logic expression that is then equated with the register bit of ŝ'. For all bits in ŝ', the equations are ANDed together to form $N(ŝ, x̂, ŝ')$. For the second example verification system of FIG. 6, $N(ŝ, x̂, ŝ')$ can be expressed symbolically as follows:

$N(ŝ, x̂, ŝ') = 610' == 611 \&\& 611' == \text{"}x\text{"} \&\& 620' == \text{"}z\text{"}$ In terms of pseudo-code that processes a BDD representation of $D_0$ and $N(ŝ, x̂, ŝ')$, the backward fixed-point determination can be expressed as follows:

```
D_prev = Ø;
while (D != D_prev) {
    D_prev = D;
    TMP = INEVITABLE(D)
    D = BDD_OR(TMP, D);
}
INEVITABLE( D(a_states) ) =
    BDD_FORALL(a_inputs,
```

-continued

```
        BDD_EXIST(a_nstates,
            BDD_AND( N(a_states,a_inputs,
            a_nstates),
                BDD_SUBSTITUTE(a_states,
                a_nstates, D(a_states) )
            )
        )
    )
```

The above "while" loop begins with D set to $D_0$ and iterates as long as a value for $D_{prev}$ (i.e., a $D_{k-1}(ŝ)$) is not equal to a value for D (i.e., a $D_k(ŝ)$). The states representing a next step backwards, from a $D_k(ŝ)$, are returned in BDD form by an "INEVITABLE" procedure and assigned to a variable "TMP." The procedure "BDD_OR" then performs the union of the sets of "TMP" and "D" to produce $D_{k+1}(ŝ)$.

The "INEVITABLE" procedure is a pseudo-code version of the above-discussed right-hand-side expression to the union operator. The "INEVITABLE" procedure uses a BDD expression "N" for $N(ŝ, x̂, ŝ')$, where "N" has been determined for the assumptions currently being processed. For "N," a_states corresponds to ŝ, a_inputs corresponds to $x̂$ and a_nstates corresponds to ŝ'.

While BDD_FORALL has been discussed above, the pseudo-code procedures BDD_EXIST, BDD_AND and BDD_SUBSTITUTE operate as follows. BDD_EXIST existentially quantifies, from the BDD of its second argument, the variables (in this case a_nstates) of its first argument. BDD_AND returns a BDD that is the AND (or intersection) of the sets represented by each of its BDD arguments. BDD_SUBSTITUTE performs the following variable-name substitution in the BDD of its third argument: variables in the BDD specified by the first argument are replaced by the corresponding variables of the second argument.

2.4 Reachable States Set

While the above procedure results in a set D containing all states that are either deadend states, or that lead inevitably to deadend states, some of the states in D may not be reachable from the initial states of the environment. With $R_0(ŝ)$ defined as the set of initial states of the environment, we define a set $R_{k+1}(ŝ)$ to be the set of all states reachable in one transition from $R_k(ŝ)$ and $R(ŝ)$ to be the set of all states reachable from $R_0(ŝ)$. $R_0(ŝ)$ is defined as the set of initial states of the environment monitor, that can be, for example, the state in which all registers of the monitor contain zero.

$R(ŝ)$ can be determined as a stepwise, forward, fixed-point determination. In mathematical set notation, this fixed-point determination can be expressed as follows (see step 715 of FIG. 7B):

$$R_{k+1}(ŝ) = R_k(ŝ) \cup \{ŝ | (\exists_{ŝ} \exists_{x̂} N(ŝ, x̂, ŝ') == 1 \&\& R_k(ŝ) == 1)|_{ŝ \to ŝ}\}$$

As can be seen above, the right-hand-side expression to the union operator provides a state ŝ for extending $R_k(ŝ)$ if there exists an input $x̂$ and a state ŝ, where ŝ is a member of $R_k(ŝ)$, such that ŝ, $x̂$ and ŝ' are a valid transition. In terms of pseudo-code that processes BDDs, the forward fixed-point determination can be expressed as follows:

```
R_prev = Ø;
while (R != R_prev) {
    R_prev = R;
    TMP = REACHABLE(R)
    R = BDD_OR(TMP, R);
```

-continued

```
    }
    REACHABLE ( R(a_states) ) =
    BDD_SUBSTITUTE(a_nstates, a_states,
        BDD_EXIST(a_inputs,
            BDD_EXIST(a_states,
                BDD_AND( R(a_states),
                    N(a_states,a_inputs,
                    a_nstates)
                )
            )
        )
    )
```

The above "while" loop begins with R set to $R_0$ and iterates as long as a value for $R_{prev}$ (i.e., a $R_{k-1}(\hat{s})$) is not equal to a value for R (i.e., a $R_k(\hat{s})$). The states representing a next step forward, from a $R_k(\hat{s})$, are returned in BDD form by a "REACHABLE" procedure and assigned to a variable "TMP." The procedure "BDD_OR" then performs the union of the sets of "TMP" and "R" to produce $R_{k+1}(\hat{s})$.

The "REACHABLE" procedure is a pseudo-code version of the above-discussed right-hand-side expression to the union operator.

2.5 Reachable Deadend States Set

The set of reachable deadend states, referred to as $RD(\hat{s})$, is the intersection of the sets $R(\hat{s})$ and $D(\hat{s})$ (see step 716 of FIG. 7B). In pseudo-code, this can be expressed as follows:

$RD=BDD\_AND(R,D)$

Reducing $D(\hat{s})$ to $RD(\hat{s})$ is an efficiency technique, and use of $D(\hat{s})$ in the below steps will still result in functionally correct results.

2.6 Fail Function Augmented for Deadend Avoidance

An augmented fail function "F" with deadend avoidance, referred to as $F^{da}$, can be determined from the above determined relation $N(\hat{s},\hat{x},\hat{s}')$ and set $RD(\hat{s})$ (see step 717 of FIG. 7B). In mathematical set notation, determination of $F^{da}$ can be described as follows:

$F^{da}(\hat{s},\hat{x}) = \exists_{\hat{s}'}(N(\hat{s},\hat{x},\hat{s}')==1\&\&(RD(\hat{s}))|_{\hat{s}\to\hat{s}'})==1)$ $F^{da}(\hat{s},\hat{x})$ contains the set of present state and input pairs such that there exists a next state, but the next state is either a deadend state or leads inexorably to a deadend state. In terms of pseudo-code processing BDDs, determination of $F^{da}(\hat{s},\hat{x})$ can be expressed as follows:

```
F_WITH_DA ( RD(a_states) ) =
BDD_EXISTS(a_nstates,
    BDD_AND( N(a_states, a_inputs, a_nstates),
        BDD_SUBSTITUTE(a_states, a_nstates,
        RD(a_states) )
    )
)
```

2.7 Augmented Equivalent Combinational Assumption Constraints $F^{da}(\hat{s},\hat{x})$ can be used to form the following constraint, that augments the equivalent combinational assumption constraints (see step 718 of FIG. 7B):

$F^{da}(\hat{s},\hat{x})==0$

For the second example verification system of FIG. 6, the augmented equivalent combinational assumption constraint set can be expressed as follows:

$(((!y\&\&610)||(y\&\&620))==0$ $F^{da}(\hat{s},\hat{x})==0$

Depending upon the constraint solver, an alternate format, for the augmented equivalent combinational assumption constraints, is to find solutions where all of the following expressions return a value of Logic One:

$!((!y\&\&x2)||(y\&\&z1))$ $!F^{da}(\hat{s},\hat{x})$

Expressed in terms of pseudo-code, that returns a BDD for a constraint solver, the constraint can be determined as follows:

BDD_NOT(F_WITH_DA(RD))

Where "BDD_NOT" returns a BDD that is the inverse of its BDD argument.

3. Conversion With Strong Deadend Avoidance

The above method for deadend avoidance is sufficient if, as shown in the example of FIG. 6, the environment receives no inputs from the DUT/DUV. However, if the environment is subject to variables not under its control, stronger deadend avoidance constraints may be needed.

In this case, the deadend avoidance method of above can have its augmented deadend states set determined as follows:

$D_{k+1}(\hat{s}) = D_k(\hat{s}) \cup \{\hat{s} \exists_{xout} \forall_{xin} \exists_{\hat{s}'} N(\hat{s},xout,xin,\hat{s}')==1\&\& (D_k(\hat{s})|_{\hat{s}\to\hat{s}'})==1\}$ Where $N(\hat{s},xout,xin,\hat{s}')$ differs from $N(\hat{s},\hat{x},\hat{s}')$ by splitting the $\hat{x}$ into two parts: "xout," which are outputs of the DUT/DUV; and "xin" which are inputs to the DUT/DUV. The distinction is significant since the "xin" signals are under direct control of the environment while the "xout" signals are not. The above equation is stating that even if there is only one combination of "xout" signals that would cause a transition to a state already a member of a $D_k(\hat{s})$, the $\hat{s}$ should be included in $D_{k+1}(\hat{s})$.

A potential problem with strong deadend avoidance, however, is that testing of the design can become limited such that some design flaws may no longer be detectable.

For example, consider the case where "z" of FIG. 6 is an output of the DUT/DUV and an input to the environment. In this case, no constraint can be added, to the equivalent combinational assumption constraint set, that would prevent the "z" from being set to a Logic One value one cycle after the "x" is set to a Logic One value.

4. Symbolic Example of Deadend State Avoidance

This section symbolically simulates operation of the above steps of Section 2 ("Conversion With Deadend Avoidance") upon the example of FIG. 6.

As discussed above, for the example of FIG. 6, $\hat{s}$ is 610, 611 and 620, while $\hat{x}$ is "x," "y" and "z." For purposes of a symbolic example, 610, 611 and 620 are given the following alternative names: x2, x1 and z1.

Symbolically, existential and universal quantification are accomplished as follows. The expression, from which a variable to be quantified, is converted into two forms: one form in which a value of Logic One is substituted for the quantified variable and another in which a value of Logic Zero is substituted. Then, for existential quantification, the logical OR of the two forms is created while, for universal quantification, the logical AND is performed.

4.1 Fail Function

The "fail function" $F(\hat{s},\hat{x})$ was already determined above and, with the new variable names for 610 and 620, it can be expressed as follows:

$$F(\hat{s},\hat{x})=(!y\&\&x2)\|(y\&\&z1)$$

4.2 Deadend States Set

The set of deadend states, $D_0$, can be expressed in terms of $F(\hat{s},\hat{x})$ as follows:

$$D_0=\{\hat{s}|\forall_{\hat{x}}F(\hat{s},\hat{x})=1\}$$

$$D_0=\{\hat{s}|\forall_x\forall_y\forall_z(!y\&\&x2)\|(y\&\&z1)\}$$

$$D_0=\{\hat{s}|\forall_x\forall_y(!y\&\&x2)\|(y\&\&z1)\}$$

$$D_0=\{\hat{s}|\forall_x(x2\&\&z1)\}$$

$$D_0=\{\hat{s}|(x2\&\&z1)\}$$

4.3 Augmented Deadend States Set

Next, $D(\hat{s})$ can be determined as a stepwise, backward, fixed-point determination from $D_0$ using the following formula:

$$D_{k+1}(\hat{s})=D_k(\hat{s})\cup\{\hat{s}|\forall_{\hat{x}}\exists_{\hat{s}'}N(\hat{s},\hat{x},\hat{s}')==1\&\&(D_k(\hat{s})|_{\hat{s}\to\hat{s}'})==1\}$$

$N(\hat{s},\hat{x},\hat{s}')$ was already determined above for FIG. 6 and, expressed in terms of the new names for 610, 611 and 620, it can be expressed as follows:

$$N(\hat{s},\hat{x},\hat{s}')=(x2'==x1)\&\&(x1'==x)\&\&(z1'==z)$$

The determination of $D_1$ can be expressed as follows:

$$D_1=D_0\cup\{\hat{s}|\forall_{\hat{x}}\exists_{\hat{s}'}N(\hat{s},\hat{x},\hat{s}')==1\&\&(D_0(\hat{s})|_{\hat{s}\to\hat{s}'})==1\}$$

$$D_1=(x2\&\&z1)\cup\{\hat{s}|\forall_x\forall_y\forall_z\exists_{x1'}\exists_{x2'}\exists_{z1'}((x2'==x1)\&\&(x1'==x)\&\&(z1'==z))\&\&((x2\&\&z1)|_{\hat{s}\to\hat{s}'})\}$$

$$D_1=(x2\&\&z1)\cup\{\hat{s}|\forall_x\forall_y\forall_z\exists_{x1'}\exists_{x2'}\exists_{z1'}((x2==x1)\&\&(x1'==x)\&\&(z1'==z))\&\&(x2'\&\&z1')\}$$

$$D_1=(x2\&\&z1)\cup\{\hat{s}|\forall_x\forall_y\forall_z\exists_{x1'}\exists_{x2'}((x2'==x1)\&\&(x1'==x)\&\&z)\&\&x2'\}$$

$$D_1=(x2\&\&z1)\cup\{\hat{s}|\forall_x\forall_y\forall_z\exists_{x1'}(x1\&\&(x1'==x)\&\&z)\}$$

$$D_1=(x2\&\&z1)\cup\{\hat{s}|\forall_x\forall_y\forall_z(x1\&\&z)\}$$

$$D_1=(x2\&\&z1)\cup\{\hat{s}|\forall_x\forall_y(\emptyset)\}$$

$$D_1=(x2\&\&z1)\cup\{\hat{s}|\emptyset\}$$

Since a fixed point has been reached, $D(\hat{s})$ has been found to be $(x2\&\&z1)$.

4.4 Reachable States Set

With $R_0(\hat{s})$ defined as the set of initial states of the environment monitor, for purposes of this example, the initial state can be defined as all registers containing zero and therefore can be expressed symbolically as:

$$R_0(\hat{s})=!x1\&\&!x2\&\&!z1$$

$R(\hat{s})$ can be determined as a stepwise, forward, fixed-point determination with the following formula:

$$R_{k+1}(\hat{s})=R_k(\hat{s})\cup\{\hat{s}|\exists_{\hat{x}}\exists_{\hat{s}}N(\hat{s},\hat{x},\hat{s}')==1\&\&R_k(\hat{s})==1)|_{\hat{s}'\to\hat{s}}\}$$

The determination of $R_1$ can be expressed as follows:

$$R_1=R_0\cup\{\hat{s}|(\exists_{\hat{x}}\exists_{\hat{s}}N(\hat{s},\hat{x},\hat{s}')==1\&\&R_0)|_{\hat{s}'\to\hat{s}}\}$$

$$R_1=(!x1\&\&!x2\&\&!z1)\cup\{\hat{s}|(\exists_x\exists_y\exists_z\exists_{x1}\exists_{x2}\exists_{z1}(x2==x1)\&\&(x1'==x)\&\&(z1'==z)\&\&(!x1\&\&!x2\&\&!z1))|_{\hat{s}\to\hat{s}'}\}$$

$$R_1=(!x1\&\&!x2\&\&!z1)\cup\{\hat{s}|(\exists_x\exists_y\exists_z\exists_{x1}\exists_{x2}(x2'==x1)\&\&(x1'==x)\&\&(z1'==z)\&\&(!x1\&\&!x2))|_{\hat{s}\to\hat{s}'}\}$$

$$R_1=(!x1\&\&!x2\&\&!z1)\cup\{\hat{s}|(\exists_x\exists_y\exists_z\exists_{x1}(x2'==x1)\&\&(x1'==x)\&\&(z1'==z)\&\&!x1)|_{\hat{s}\to\hat{s}'}\}$$

$$R_1=(!x1\&\&!x2\&\&!z1)\cup\{\hat{s}|(\exists_x\exists_y\exists_z!x2'\&\&(x1'==x)\&\&(z'==z))|_{\hat{s}\to\hat{s}'}\}$$

$$R_1=(!x1\&\&!x2\&\&!z1)\cup\{\hat{s}|(\exists_x\exists_y!x2'\&\&(x1'==x))|_{\hat{s}\to\hat{s}'}\}$$

$$R_1=(!x1\&\&!x2\&\&!z1)\cup\{\hat{s}|(\exists_x!x2'\&\&(x1'==x))|_{\hat{s}\to\hat{s}'}\}$$

$$R_1=(!x1\&\&!x2\&\&!z1)\cup\{\hat{s}|(!x2')|_{\hat{s}\to\hat{s}'}\}$$

$$R_1=(!x1\&\&!x2\&\&!z1)\cup!x2$$

$$R_1=!x2$$

Since a fixed point has not been reached, the determination of $R_2$ can be expressed as follows:

$$R_2=R_1\cup\{\hat{s}|(\exists_{\hat{x}}\exists_{\hat{s}}N(\hat{s},\hat{x},\hat{s}')==1\&\&R_1)|_{\hat{s}'\to\hat{s}}\}$$

$$R_2=(!x2)\cup\{\hat{s}|(\exists_x\exists_y\exists_z\exists_{x1}\exists_{x2}\exists_{z1}(x2'==x1)\&\&(x1'==x)\&\&(z1'==z)\&\&(!x2))|_{\hat{s}\to\hat{s}'}\}$$

$$R_2=(!x2)\cup\{\hat{s}|(\exists_x\exists_y\exists_z\exists_{x1}\exists_{x2}(x2'==x1)\&\&(x1'==x)\&\&(z1'==z)\&\&(!x2))|_{\hat{s}\to\hat{s}'}\}$$

$$R_2=(!x2)\cup\{\hat{s}|(\exists_x\exists_y\exists_z\exists_{x1}(x2'==x1)\&\&(x1'==x)\&\&(z1'==z))|_{\hat{s}\to\hat{s}'}\}$$

$$R_2=(!x2)\cup\{\hat{s}|(\exists_x\exists_y\exists_z(x1'==x)\&\&(z1'==z))|_{\hat{s}\to\hat{s}'}\}$$

$$R_2=(!x2)\cup\{\hat{s}|(\exists_x\exists_y(x1'==x))|_{\hat{s}\to\hat{s}'}\}$$

$$R_2=(!x2)\cup\{\hat{s}|(\exists_x(x1'==x))|_{\hat{s}\to\hat{s}'}\}$$

$$R_2=(!x2)\cup\{\hat{s}|(TRUE)|_{\hat{s}\to\hat{s}'}\}$$

$$R_2=(!x2)\cup TRUE$$

$$R_2=TRUE$$

We have reached a fixed point indicating that all states of the environment monitor are reachable in two steps.

4.5 Reachable Deadend States Set

The set of reachable deadend states, referred to as $RD(\hat{s})$, is the intersection of the sets $R(\hat{s})$ and $D(\hat{s})$. This can be determined symbolically as follows:

$$RD(\hat{s})=TRUE\&\&x2\&\&z1=x2\&\&z1$$

4.6 Fail Function Augmented for Deadend Avoidance

The augmented fail function $F^{da}$ can be determined from the above determined sets $N(\hat{s},\hat{x},\hat{s}')$ and $RD(\hat{s})$. In mathematical set notation, determination of $F^{da}$ can be described as follows:

$$F^{da}(\hat{s},\hat{x})=\exists_{\hat{s}'}(N(\hat{s},\hat{x},\hat{s}')==1\&\&(RD(\hat{s})|_{\hat{s}\to\hat{s}'})==1)$$

$$F^{da}(\hat{s},\hat{x})=\exists_{x1'}\exists_{x2'}\exists_{z1'}(((x2'==x1)\&\&(x1'==x)\&\&(z1'==z))\&\&((x2\&\&z1)|_{\hat{s}\to\hat{s}'}))$$

$$F^{da}(\hat{s},\hat{x})=\exists_{x1'}\exists_{x2'}\exists_{z1'}(((x2'==x1)\&\&(x1'==x)\&\&(z1'==z))\&\&(x2'\&\&z1'))$$

$$F^{da}(\hat{s},\hat{x})=\exists_{x1'}\exists_{x2'}(((x2'==x1)\&\&(x1'==x)\&\&z)\&\&x2')$$

$$F^{da}(\hat{s},\hat{x})=\exists_{x1'}(x1'==x)\&\&z)$$

$$F^{da}(\hat{s},\hat{x})=(x1\&\&z)$$

4.7 Augmented Equivalent Combinational Assumption Constraints $F^{da}(\hat{s},\hat{x})$ can be used to form a constraint, that creates the following augmented equivalent combinational assumption constraints:

$$((!y\&\&x2)\|(y\&\&z1))==0$$

$$(x1\&\&z)==0$$

Alternatively, the augmented equivalent combinational assumption constraints can be expressed as follows, where RV values must be found such that all the expressions evaluate to Logic One:

$$!((!y\&\&x2)\|(y\&\&z1))$$

$$!(x1\&\&z)$$

As can be seen, the additional constraint does solve the conflict problem since, if "x1" is Logic One, "z" must be assigned the value zero.

5. Symbolic Example of Strong Deadend State Avoidance

This section symbolically simulates operation of the above steps of Section 3 ("Conversion With Strong Deadend Avoidance") upon the example of FIG. 6. As discussed above, the difference from non-strong deadend avoidance is in the backward, fixed point, determination of deadend states.

For this example, we consider "z" to be a DUT/DUV output that is therefore not controllable by the environment but, in all other respects, the example is the same as that of FIG. 6. As discussed above, the determination of $D(\hat{s})$ can be accomplished by the following formula:

$$D_{k+1}(\hat{s})=D_k(\hat{s})\cup\{\hat{s}|\exists_{xout}\forall_{xin}\exists_{\hat{s}'}N(\hat{s},xout,xin,\hat{s}')==1\&\&(D_k(\hat{s})|_{\hat{s}\to\hat{s}'})==1\}$$

Determination of $D_1(\hat{s})$ from $D_0(\hat{s})$ is as follows:

$$D_1=D_0\cup\{\hat{s}|\exists_{xout}\forall_{xin}\exists_{\hat{s}'}N(\hat{s},xout,xin,\hat{s}')==1\&\&(D_0|_{\hat{s}\to\hat{s}'})==1\}$$

$$D_1=(x2\&\&z1)\cup\{\hat{s}|\exists_z\forall_x\forall_y\exists_{x2'}\exists_{x1'}\exists_{z1'}((x2'==x1)\&\&(x1'==x)\&\&(z1'==z))\&\&((x2\&\&z1)|_{\hat{s}\to\hat{s}'})\}$$

$$D_1=(x2\&\&z1)\cup\{\hat{s}|\exists_z\forall_x\forall_y\exists_{x2'}\exists_{x1'}\exists_{z1'}((x2'==x1)\&\&(x1'==x)\&\&(z1'==z))\&\&(x2'\&\&z1')\}$$

Since the above equation for $D_1(\hat{s})$ is identical to that which was solved in Section 4.3 ("Augmented Deadend States Set"), except that "z" is existentially quantified rather than universally quantified, the determination of $D_1(\hat{s})$ continues below at the point where x1', x2' and z1' have been existentially quantified:

$$D_1=(x2\&\&z1)\cup\{\hat{s}|\exists_z\forall_x\forall_y(x1\&\&z)\}$$

$$D_1=(x2\&\&z1)\cup\{\hat{s}|\exists_z\forall_x(x1\&\&z)\}$$

$$D_1=(x2\&\&z1)\cup\{\hat{s}|\exists_z(x1\&\&z)\}$$

$$D_1=(x2\&\&z1)\cup\{\hat{s}|x1\}$$

$$D_1=(x2\&\&z1)\|x1$$

Since a fixed point has not been reached in determining $D_1(\hat{s})$, $D_2(\hat{s})$ is determined as follows:

$$D_2=D_1\cup\{\hat{s}|\exists_{xout}\forall_{xin}\exists_{\hat{s}'}N(\hat{s},xout,xin,\hat{s}')==1\&\&(D_1|_{\hat{s}\to\hat{s}'})==1\}$$

$$D_2=((x2\&\&z1)\|x1)\cup\{\hat{s}|\exists_z\forall_x\forall_y\exists_{x2'}\exists_{x1'}\exists_{z1'}((x2'==x1)\&\&(x1'==x)\&\&(z1'==z))\&\&(((x2\&\&z1)\|x1)|_{\hat{s}\to\hat{s}'})\}$$

$$D_2=((x2\&\&z1)\|x1)\cup\{\hat{s}|\exists_z\forall_x\forall_y\exists_{x2'}\exists_{x1'}\exists_{z1'}((x2'==x1)\&\&(x1'==x)\&\&(z1'==z))\&\&((x2'\&\&z1')\|x1')\}$$

$$D_2=((x2\&\&z1)\|x1)\cup\{\hat{s}|\exists_z\forall_x\forall_y\exists_{x2'}\exists_{x1'}(x2'==x1)\&\&(x1'==x)\&\&((!z\&\&x1')\|(z\&\&x2')\|(z\&\&x1'))\}$$

$$D_2=((x2\&\&z1)\|x1)\cup\{\hat{s}|\exists_z\forall_x\forall_y\exists_{x2'}(x2'==x1)\&\&(x\|!x\&\&z\&\&x2')\}$$

$$D_2=((x2\&\&z1)\|x1)\cup\{\hat{s}|\exists_z\forall_x\forall_y(x1\&\&x)\|(x1\&\&!x\&\&z)\|(!x1\&\&x)\}$$

$$D_2=((x2\&\&z1)\|x1)\cup\{\hat{s}|\exists_z\forall_x(x1\&\&x)\|(x1\&\&!x\&\&z)\|(!x1\&\&x)\}$$

$$D_2=((x2\&\&z1)\|x1)\cup\{\hat{s}|\exists_z\text{ FALSE}\}$$

$$D_2=((x2\&\&z1)\|x1)$$

Since $D_2(\hat{s})$ equals $D_1(\hat{s})$, a fixed point has been reached. Therefore, $D(\hat{s})$ equals $D_1(\hat{s})$. Since all states of the environment monitor are reachable from the initial state, $RD(\hat{s})$ equals $D(\hat{s})$.

The augmented fail function $F^{da}$ can be determined from the above determined sets $N(\hat{s},\hat{x},\hat{s}')$ and $RD(\hat{s})$. In mathematical set notation, determination of $F^{da}$ can be described as follows:

$$F^{da}(\hat{s},\hat{x})=\exists_{\hat{s}'}(N(\hat{s},\hat{x},\hat{s}')==1\&\&(RD(\hat{s})|_{\hat{s}\to\hat{s}'})==1)$$

$$F^{da}(\hat{s},\hat{x})=\exists_{x2'}\exists_{x1'}\exists_{z1'}(((x2'==x1)\&\&(x1'==x)\&\&(z1'==z))\&\&(((x2\&\&z1)\|x1)|_{\hat{s}\to\hat{s}'}))$$

$$F^{da}(\hat{s},\hat{x})=\exists_{x2'}\exists_{x1'}\exists_{z1'}(((x2'==x1)\&\&(x1'==x)\&\&(z1'==z))\&\&((x2'\&\&z1')\|x1'))$$

It can be observed that the equation just-above is the same as one which was solved in this Section 5 while determining $D_2(\hat{s})$, except that in the determination of $D_2(\hat{s})$ there was also universal quantification. Using the result determined above for $D_2(\hat{s})$, up to the point where universal quantification was performed, leads to the following result for $F^{da}(\hat{s},\hat{x})$:

$$F^{da}(\hat{s},\hat{x})=((x1\&\&x)\|(x1\&\&!x\&\&z)\|(!x1\&\&x))$$

$$F^{da}(\hat{s},\hat{x})=(x\|(x1\&\&!x\&\&z))$$

$F^{da}(\hat{s},\hat{x})$ can be used to form a constraint, that creates the following augmented equivalent combinational assumption constraints:

$$(!y\&\&x2)\|(y\&\&z1)==0$$

$$(x\|(x1\&\&!x\&\&z))==0$$

Depending upon the constraint solver, an alternate format, for the augmented equivalent combinational assumption constraints, is to find solutions where all of the following expressions return a value of Logic One:

$$!((!y\&\&x2)\|(y\&\&z1))$$

$$!(x\|(x1\&\&!x\&\&z))$$

The expression $!(x\|(x1\&\&!x\&\&z))$ can be re-written as $(!x\&\&(!x1\|x\|!z))$ that can be simplified to $(!x\&\&(!x1\|!z))$. The only RV, of $(!x\&\&(!x1\|!z))$, is "x," and finding a Logic One value for the expression requires always assigning a value of zero to "x."

Since strong deadend avoidance assumes no knowledge of the DUT/DUV output (meaning any value is possible), the result of applying such strong deadend avoidance (for the above example) is input "x" being constrained to a constant value of Logic Zero. This may lead, however, to avoiding the detection of design errors since, for example, there may be certain design errors that can only be discovered if "x" is set to a Logic One.

Knowledge of DUT/DUV structure can be used in formulating deadend avoidance constraints, but such avoidance can also lead to design errors not being detected. For example, assume in the previous example, that if the DUT/DUV is operating correctly, its "z" output is a Logic Zero in response to "x" being a Logic One. Assume, however, that the DUT/DUV contains a design error that causes "z" to be Logic One in response to "x" being Logic One. A deadend avoidance algorithm, incorporating such erroneous DUT/DUV design knowledge, would produce a constraint fixing "x" to a Logic Zero and the erroneous operation of the "z" output would never be stimulated to occur.

As an alternative to the DUT/DUV structure itself, a reference specification for the DUT/DUV (also known as a golden reference) can be used to predict its behavior. A problem with the use of such a reference specification is that it may not be available or may not be in a form suitable for deadend avoidance analysis. Assertions can be used as a partial reference specification to reduce, relative to strong deadend avoidance, the likelihood of design errors not being detected.

6. Hardware Environment

Figure 9:
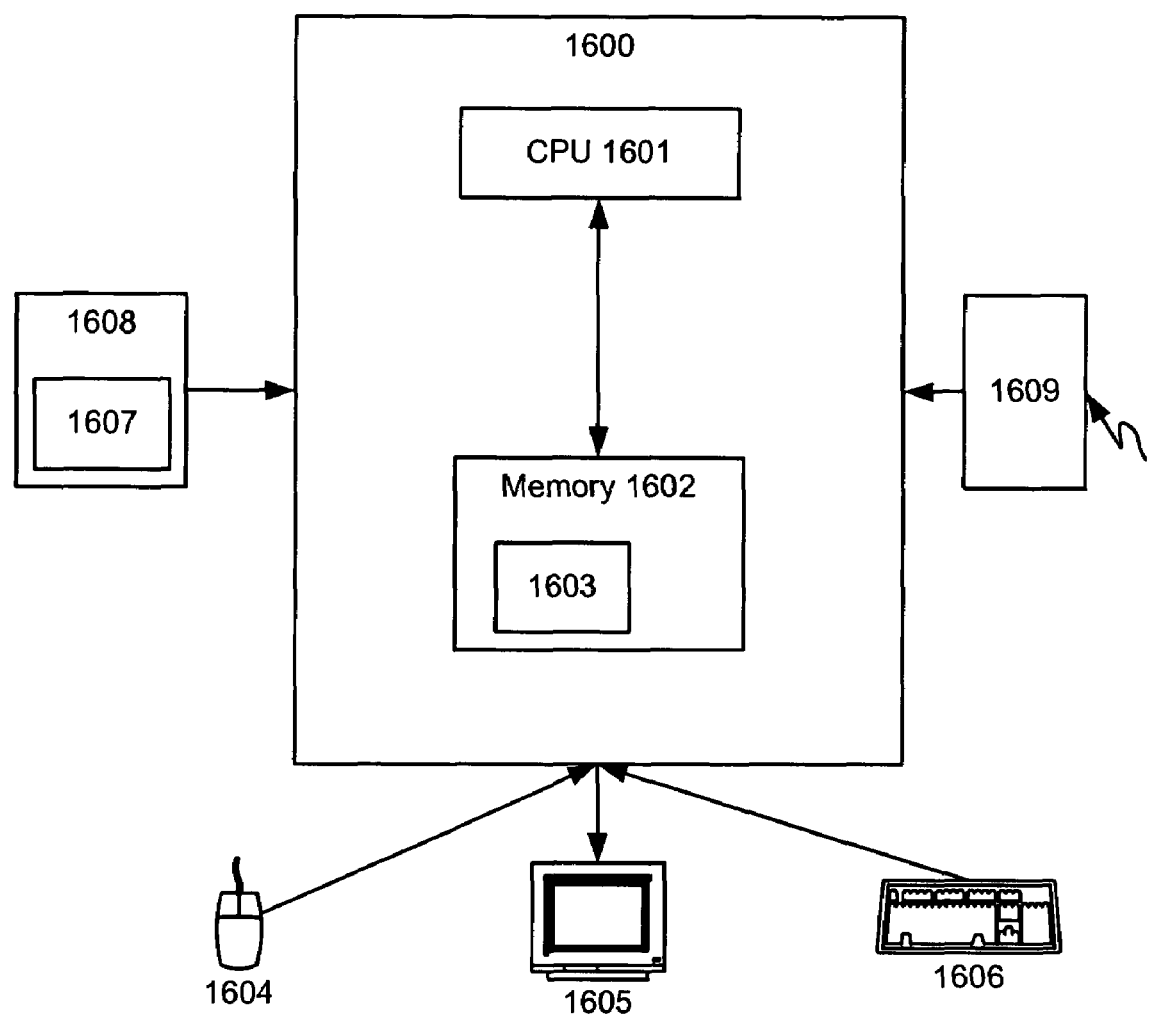
FIG. 9 shows a computing hardware environment within which to operate the present invention.

The sequential constraint solving architecture of the present invention can be executed within a computing environment (or data processing system) such as that of FIG. 9. FIG. 9 depicts a workstation computer 1600 comprising a Central Processing Unit (CPU) 1601 (or other appropriate processor or processors) and a memory 1602. Memory 1602 has a portion of its memory 1603 in which are stored the software tools (or computer programs) and data of the present invention. While memory 1603 is depicted as a single region, those of ordinary skill in the art will appreciate that, in fact, such software and data may be distributed over several memory regions or several computers. Furthermore, depending upon the computer's memory organization (such as virtual memory), memory 1602 may comprise several types of memory (including cache, random access memory, hard disk and networked file server). Computer 1600 can be equipped with a display monitor 1605, a mouse pointing device 1604 and a keyboard 1606 to provide interactivity between the software of the present invention and the chip designer. Computer 1600 also includes a way of reading computer readable instructions from a computer readable medium 1607, via a medium reader 1608, into the memory 1602. Computer 1600 also includes a way of reading computer readable instructions via the Internet (or other network) through network interface 1609.

In one embodiment, the processes for solving sequential constraints can be implemented within software produced by Synopsys, Inc., of Mountain View, Calif., USA. An example of such Synopsys software is Magellan. Magellan verifies a high-level specification of a circuit design, that has typically been specified in Verilog or VHDL. Magellan provides two main types of verification techniques: simulation (using the VCS HDL Simulator for a Verilog DUT/DUV or the Scirocco simulator for a VHDL DUT/DUV) or formal property verification.

In some embodiments, computer programs embodying the present invention are stored in a computer readable medium, e.g. CD-ROM or DVD. In other embodiments, the computer programs are embodied in an electromagnetic carrier wave. For example, the electromagnetic carrier wave may include the programs being accessed over a network.

While the invention has been described in conjunction with specific embodiments, it is evident that many alternatives, modifications and variations will be apparent to those skilled in the art in light of the foregoing description. Accordingly, it is intended to embrace all such alternatives, modifications and variations as fall within the spirit and scope of the appended claims and equivalents.

What is claimed is:

1. An electromagnetic waveform comprising a computer program, the computer program for performing simulation verification of a representation of an electronic design of an integrated circuit (IC), the computer program performing the following steps when executed by a data processing system:
   conversion, by logic synthesis, of declarative assumption constraints, comprising at least one sequential assumption constraint, into a gate-level assumption representation;
   converting the gate-level assumption representation into a hybrid representation comprising assumption pipelines and equivalent combinational assumption constraints.

2. A method of performing simulation verification, comprising:
   conversion, by logic synthesis, of declarative assumption constraints, comprising at least one sequential assumption constraint, into a gate-level assumption representation;
   converting the gate-level assumption representation into a representation comprising equivalent combinational assumption constraints.

3. The method of claim 2, wherein the step of conversion by logic synthesis further comprises the following steps:
   conversion of declarative assumption constraints, comprising at least one sequential assumption constraint, into an HLHDL (High-Level Hardware Description Language) representation; and
   conversion of the HLHDL representation into a gate-level representation.

4. The method of claim 2, wherein the step of converting the gate-level assumption representation further comprises the following step:
   identifying deadend states.

5. The method of claim 4, wherein the step of identifying deadend states comprises the following step:
   determining a deadend states set from a fail function.

6. The method of claim 4, wherein the step of identifying deadend states comprises the following step:
   determining an augmented deadend states set backward from a deadend states set until a fixed point is reached.

7. The method of claim 6, wherein the step of determining an augmented deadend states set comprises the following step:
   existential quantification of a variable representing an output from a design under test or verification to an environment.

8. The method of claim 4, further comprising the following step:
   augmenting the equivalent combinational assumption constraints such that the deadend states are avoided.

9. The method of claim 2, wherein the step of converting the gate-level assumption representation further comprises the following step:
   determining a fail function from assumption gates.

10. The method of claim 2, wherein the step of converting the gate-level assumption representation further comprises the following step:
    determining a reachable states set.

11. The method of claim 2, wherein the step of converting the gate-level assumption representation further comprises the following step:
   determining a valid transition function by identifying a type of transitive fanin of a register bit of an assumption pipeline.

12. The method of claim 2, wherein the step of converting the gate-level assumption representation further comprises the following step:
   determining an augmented fail function using a valid transition function and a set of deadend states.

13. The method of claim 12, further comprising the following step:
   augmenting the equivalent combinational assumption constraints with a constraint based upon the augmented fail function.

14. The method of claim 2, wherein the step of converting the gate-level assumption representation further comprises the following step:
   identifying augmented assumption gates, as a type of transitive fanin, starting from an assumption error output.

15. The method of claim 2, wherein the representation comprising equivalent combinational assumption constraints is a hybrid representation also comprising an assumption pipeline.

16. An electromagnetic waveform comprising a computer program, the computer program for performing simulation verification, the computer program performing the following steps when executed by a data processing system:
   conversion, by logic synthesis, of declarative assumption constraints, comprising at least one sequential assumption constraint, into a gate-level assumption representation; and
   converting the gate-level assumption representation into a representation comprising equivalent combinational assumption constraints.

17. A computer program product comprising:
   a computer usable medium having computer readable code embodied therein for performing simulation verification, the computer program product including:
   computer readable program code devices configured to cause a computer to effect conversion, by logic synthesis, of declarative assumption constraints, comprising at least one sequential assumption constraint, into a gate-level assumption representation; and
   computer readable program code devices configured to cause a computer to effect converting the gate-level assumption representation into a representation comprising equivalent combinational assumption constraints.

* * * * *